(12) United States Patent
Yamaguchi

(10) Patent No.: US 12,389,656 B2
(45) Date of Patent: Aug. 12, 2025

(54) SEMICONDUCTOR DEVICE AND METHOD OF MANUFACTURING THE SAME

(71) Applicant: Renesas Electronics Corporation, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 18/407,264

(22) Filed: Jan. 8, 2024

(65) Prior Publication Data

US 2024/0145552 A1 May 2, 2024

Related U.S. Application Data

(60) Continuation of application No. 17/222,534, filed on Apr. 5, 2021, now Pat. No. 11,973,119, which is a
(Continued)

(30) Foreign Application Priority Data

May 18, 2018 (JP) .................. 2018-096243

(51) Int. Cl.
*H10D 64/68* (2025.01)
*G11C 11/22* (2006.01)
(Continued)

(52) U.S. Cl.
CPC ......... *H10D 64/033* (2025.01); *G11C 11/223* (2013.01); *H10B 51/10* (2023.02);
(Continued)

(58) Field of Classification Search
CPC ............. H01L 29/40111; H01L 29/516; H01L 29/78391; H10D 30/701; H10D 64/689
See application file for complete search history.

(56) References Cited

U.S. PATENT DOCUMENTS 6,936,876 B2   8/2005   Zhen
7,851,777 B2   12/2010  Arai et al.
(Continued)

FOREIGN PATENT DOCUMENTS

CN   1681143 A    10/2005
CN   108441830 A  8/2018
(Continued)

OTHER PUBLICATIONS

NIH PubChem Atomic Radius for nitrogen (2024) (retrieved from https://pubchem.ncbi.nlm.nih.gov/ptable/atomic-radius/) (Year: 2024).*
(Continued)

*Primary Examiner* — Michele Fan
(74) *Attorney, Agent, or Firm* — Rimon P.C.

(57) ABSTRACT

A first amorphous film containing hafnium, oxygen and a first element such as zirconium is formed, a plurality of grains containing a second element different from any of hafnium, oxygen and the first element are formed on the first amorphous film, a second amorphous film made of the same material as the first amorphous film is formed on the plurality of grains and on the first amorphous film, and a metal film is formed on the second amorphous film. Thereafter, by performing heat treatment, the first amorphous film is crystallized to form a first orthorhombic ferroelectric film and the second amorphous film is crystallized to form a second orthorhombic ferroelectric film.

9 Claims, 12 Drawing Sheets

Related U.S. Application Data division of application No. 16/409,358, filed on May 10, 2019, now Pat. No. 10,998,408.

(51) Int. Cl.
 *H10B 51/10* (2023.01)
 *H10B 51/30* (2023.01)
 *H10D 30/69* (2025.01)
 *H10D 64/01* (2025.01)

(52) U.S. Cl.
 CPC .......... *H10B 51/30* (2023.02); *H10D 30/701* (2025.01); *H10D 64/689* (2025.01); *H10D 64/691* (2025.01)

(56) References Cited

U.S. PATENT DOCUMENTS

| | | |
|---|---|---|
| 2003/0054572 A1 | 3/2003 | Fujimori |
| 2008/0203485 A1 | 8/2008 | Chudzik et al. |
| 2009/0224301 A1 | 9/2009 | Yamakawa et al. |
| 2009/0261395 A1 | 10/2009 | Boescke |
| 2013/0298977 A1 | 11/2013 | Chen et al. |
| 2014/0070289 A1 | 3/2014 | Tanaka et al. |
| 2014/0070290 A1 | 3/2014 | Inumiya et al. |
| 2015/0340372 A1 | 11/2015 | Pandey et al. |
| 2015/0380641 A1 | 12/2015 | Ino et al. |
| 2016/0005961 A1 | 1/2016 | Ino |
| 2016/0308070 A1 | 10/2016 | Chang et al. |
| 2017/0103988 A1 | 4/2017 | Nishida et al. |
| 2018/0204735 A1 | 7/2018 | Yuasa et al. |
| 2018/0240803 A1 | 8/2018 | Yoo |
| 2018/0337055 A1 | 11/2018 | Yamaguchi |
| 2019/0074295 A1 | 3/2019 | Schroder |
| 2019/0386142 A1* | 12/2019 | Gros-Jean ............... H10B 51/30 |
| 2019/0393029 A1 | 12/2019 | Karbasian et al. |
| 2020/0035493 A1 | 1/2020 | Clark et al. |
| 2020/0105770 A1 | 4/2020 | Yoo |
| 2020/0105897 A1* | 4/2020 | Hsu .................... H01L 21/0228 |

FOREIGN PATENT DOCUMENTS

| | | |
|---|---|---|
| JP | 2004-259986 A | 9/2004 |
| JP | 2008-028197 A | 2/2008 |
| JP | 2009-212448 A | 9/2009 |
| JP | 2014-053568 A | 3/2014 |
| JP | 2015-065251 A | 4/2015 |
| JP | 2017-054903 A | 3/2017 |
| TW | 535298 A | 6/2003 |
| TW | 535298 B | 6/2003 |
| TW | 201637172 A | 10/2016 |
| WO | 2004/027877 A1 | 4/2004 |
| WO | 2017027744 A1 | 2/2017 |

OTHER PUBLICATIONS

U.S. PTO Non-Final Office Action issued in related parent U.S. Appl. No. 16/409,359, dated Aug. 26, 2020.
U.S. PTO Notice of Allowance issued in related parent U.S. Appl. No. 16/409,358, dated Feb. 4, 2021.
Related parent U.S. Appl. No. 16/409,358, filed May 10, 2019.
Notice of Reasons for Refusal received in Japanese Patent Application No. 2023-212917, mailed Jun. 18, 2024.
Japanese Notice of Reason for Refusal issued in corresponding Japanese Patent Application No. 2018-096243, dated Jan. 4, 2022, with English translation.
Japanese Notice of Reason for Refusal issued in corresponding Japanese Patent Application No. 2018-096243, dated Jul. 6, 2021, with English translation.
H. Ohashi, "Ortho Rhombic System will be stopped and Ortho-rhombic System will be used", Crystallographic Society of Japan, vol. 57, No. 2, 2015, pp. 131-133, with English translation of line 2-15, left column, p. 131.
First Office Action received in Chinese Patent Application No. 2019103149148, dated Nov. 4, 2023.
Taiwanese Office Action issued in corresponding Taiwanese Patent Application No. 108115483, dated Nov. 25, 2022, with English translation.
Office Action issued in Taiwanese Patent Application No. 112131829, issued on Nov. 23, 2023, w/English MT.
Non-Final Rejection issued in corresponding U.S. Appl. No. 17/222,534, dated Mar. 31, 2023.
Japanese Office Action issued in corresponding Japanese Patent Application No. 2022-127967 dated Jul. 4, 2023, with English translation.

* cited by examiner

FIG. 3
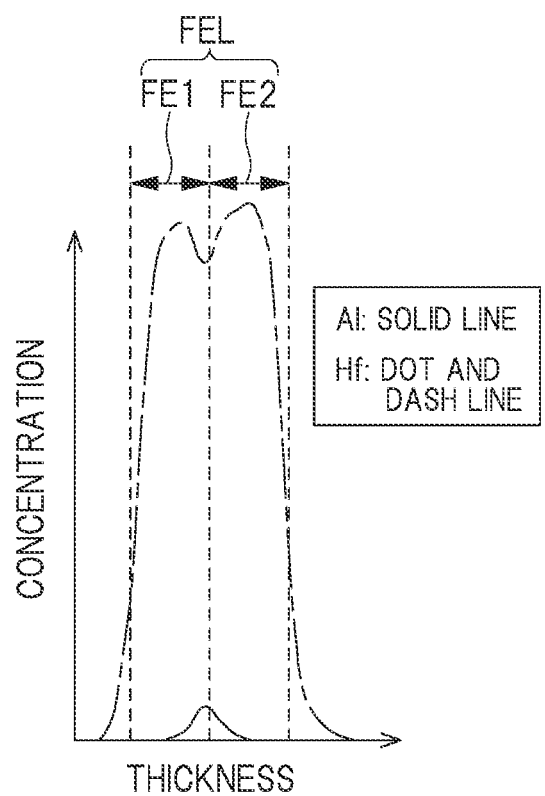
FIRST EMBODIMENT
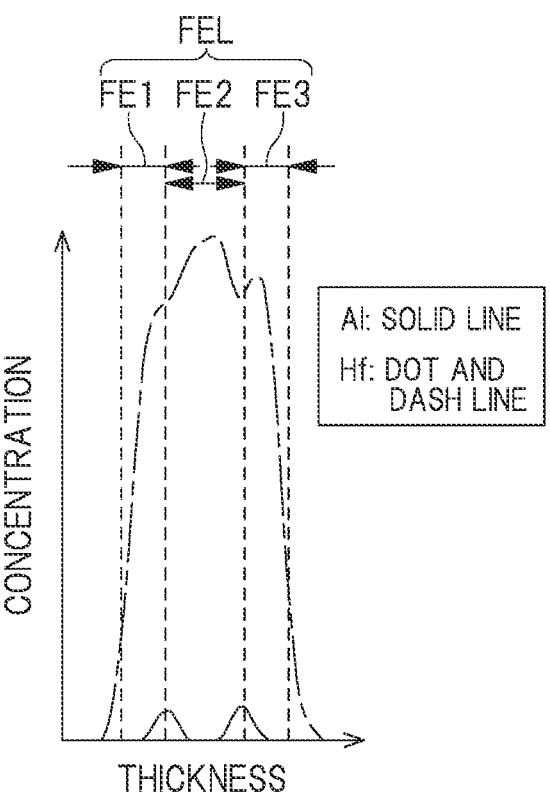
SECOND EMBODIMENT
FIG. 4
| OPERATION \ APPLIED VOLTAGE | Vd | Vg | Vs | Vb |
|---|---|---|---|---|
| WRITING | 0V | −4V | 0V | 0V |
| ERASING | 0V | 4V | 0V | 0V |
| READING | Vdd | 0V | 0V | 0V |

SEMICONDUCTOR DEVICE AND METHOD OF MANUFACTURING THE SAME

CROSS-REFERENCE TO RELATED APPLICATIONS

This Application is a Continuation of U.S. application Ser. No. 17/222,534, filed on Apr. 5, 2021, which is a Divisional of U.S. patent Application Ser. No. 16/409,358 filed May 10, 2019, now U.S. Pat. No. 10,998,408, issued on May 4, 2021 which claims priority from Japanese Patent Application No. 2018-096243 filed on May 18, 2018, the content of each are hereby incorporated by reference into this application.

TECHNICAL FIELD OF THE INVENTION

The present invention relates to a semiconductor device and a method of manufacturing the same, and particularly relates to a technique effectively applicable to a semiconductor device used as a memory element including a ferroelectric film and a method of manufacturing the same.

BACKGROUND OF THE INVENTION

In recent years, ferroelectric memory cells using a ferroelectric layer have been developed as semiconductor memory elements operating at a low voltage. A ferroelectric memory cell is a non-volatile memory cell in which a writing state and an erasing state of information are changed by controlling the direction of polarization of the ferroelectric layer.

US Patent Application Publication No. 2015/0340372 (Patent Document 1) discloses a non-volatile memory cell in which a ferroelectric layer formed above a selection transistor is electrically connected to one of diffusion regions of the selection transistor.

SUMMARY OF THE INVENTION

In a ferroelectric memory cell using a $HfO_2$ film constituting a ferroelectric layer, a crystal phase of the $HfO_2$ film needs to be orthorhombic. However, the orthorhombic crystal is a metastable phase, and when an amorphous $HfO_2$ film is formed on a semiconductor substrate and heat treatment for crystallization is then performed at a high temperature of, for example, about 700 to 1000° C. in a manufacturing process of a semiconductor device, the crystal phase of the $HfO_2$ film becomes monoclinic, so that the $HfO_2$ film becomes paraelectric instead of ferroelectric. In the ferroelectric memory cell, a threshold voltage is controlled by applying positive and negative voltages to a gate electrode and controlling the inversion of the polarization domain in the ferroelectric layer. Accordingly, the ferroelectric memory cell has a problem that the variation in the threshold voltage with respect to the gate voltage increases due to the variations in the crystal grain size and crystal orientation of the ferroelectric layer. Namely, an object is to improve the performance of the semiconductor device by aligning the crystal grain size and crystal orientation of the ferroelectric layer.

The other objects and novel characteristics of the present invention will be apparent from the description of the present specification and the accompanying drawings.

The following is a brief description of an outline of the typical embodiment disclosed in the present application.

A method of manufacturing a semiconductor device according to one embodiment includes the steps of: (a) forming a first amorphous film containing hafnium, oxygen and a first element; (b) forming a plurality of grains containing a second element, which is different from any of hafnium, oxygen and the first element, on the first amorphous film; and (c) forming a second amorphous film containing hafnium, oxygen and the first element on the plurality of grains and on the first amorphous film. The method of manufacturing a semiconductor device further includes the steps of: (d) forming a first metal film on the second amorphous film; and (e) performing heat treatment after the step (d), thereby crystallizing the first amorphous film to form an orthorhombic first ferroelectric film and crystallizing the second amorphous film to form an orthorhombic second ferroelectric film.

According to one embodiment, it is possible to improve the performance of the semiconductor device.

BRIEF DESCRIPTIONS OF THE DRAWINGS

FIG. 3 is a graph obtained by experiments conducted by an inventor of this application;

FIG. 4 is a table showing an example of voltage application conditions to each portion of a selected memory cell at the time of "writing", "erasing" and "reading";

DESCRIPTIONS OF THE PREFERRED EMBODIMENTS

Figure 1:
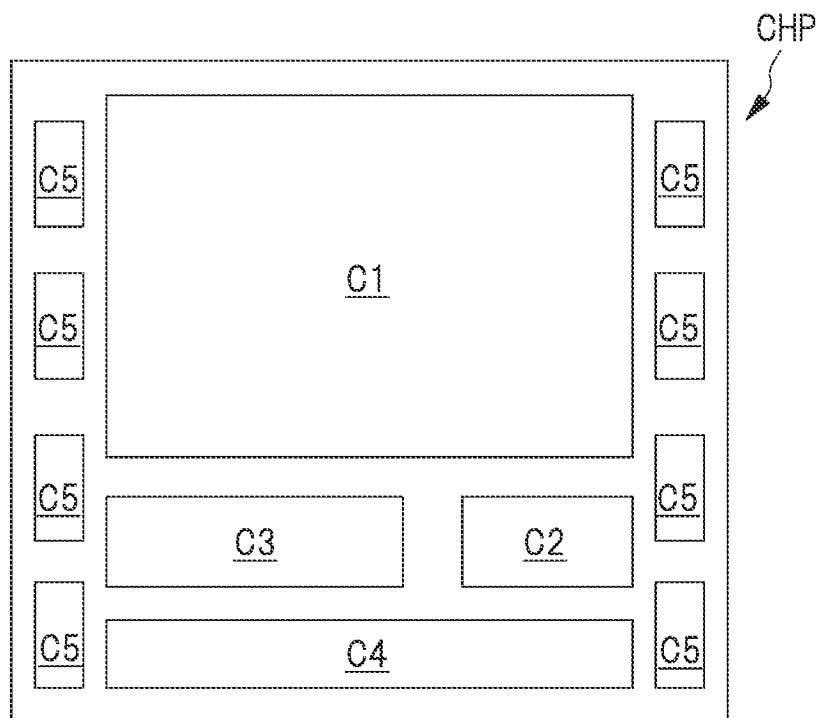
FIG. 1 is a planar layout diagram of a semiconductor chip corresponding to a semiconductor device according to a first embodiment.

In the following, the present invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof. Also, in the embodiments described below, when mentioning the number of elements (including number of pieces, values, amount, range, and the like), the number of the elements is not limited to a specific number unless otherwise stated or except the case in which the number is apparently limited to a specific number in principle, and the number larger or smaller than the specified number is also applicable. Further, in the embodiments described below, it goes without saying that the components (including element steps) are not always indispensable unless otherwise stated or except the case in which the components are apparently indispensable in principle. Similarly, in the embodiments described below, when the shape of the components, positional relation thereof, and the like are mentioned, the substantially approximate and similar shapes and the like are included therein unless otherwise stated or except the case in which it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see.

First Embodiment

A semiconductor device including a ferroelectric memory cell which is a non-volatile memory cell according to the present embodiment will be described with reference to the drawings. First, a planar layout configuration of a semiconductor chip CHP which is a semiconductor device in which a system including a ferroelectric memory cell is formed will be described with reference to FIG. 1. In FIG. 1, the semiconductor chip CHP includes a ferroelectric memory circuit C1, a CPU (Central Processing Unit) circuit C2, a RAM (Random Access Memory) circuit C3, an analog circuit C4 and an I/O (Input/Output) circuit C5.

The ferroelectric memory circuit C1 is a region in which a circuit capable of electrically rewriting stored information is provided and a plurality of ferroelectric memory cells that are non-volatile memory cells are formed as semiconductor elements.

The CPU circuit C2 is a region in which a logic circuit driven by a voltage of about 1.5 V is provided and a low breakdown voltage MISFET (Metal Insulator Semiconductor Field Effect Transistor) whose breakdown voltage is low and which can operate fast is formed as a semiconductor element.

The RAM circuit C3 is a region in which an SRAM (Static RAM) is provided and a low breakdown voltage MISFET having substantially the same structure as that in the CPU circuit C2 is formed as a semiconductor element.

The analog circuit C4 is a region in which an analog circuit is provided and a capacitive element, a resistive element, a bipolar transistor, a high breakdown voltage MISFET whose breakdown voltage is higher than that of the low breakdown voltage MISFET and which is driven by a voltage of about 6 V, and the like are formed as semiconductor elements.

The I/O circuit C5 is a region in which an input/output circuit is provided and a high breakdown voltage MISFET substantially similar to that in the analog circuit C4 is formed as a semiconductor element.

<Structure of Semiconductor Device>

Hereinafter, the structure of the semiconductor device according to the present embodiment will be described with reference to FIGS. 2 and 3. In the present embodiment, a ferroelectric memory cell MC formed in the ferroelectric memory circuit C1 and a low breakdown voltage MISFET 1Q formed in the CPU circuit C2 will be described as an example of the structure of the semiconductor device.

Figure 2:
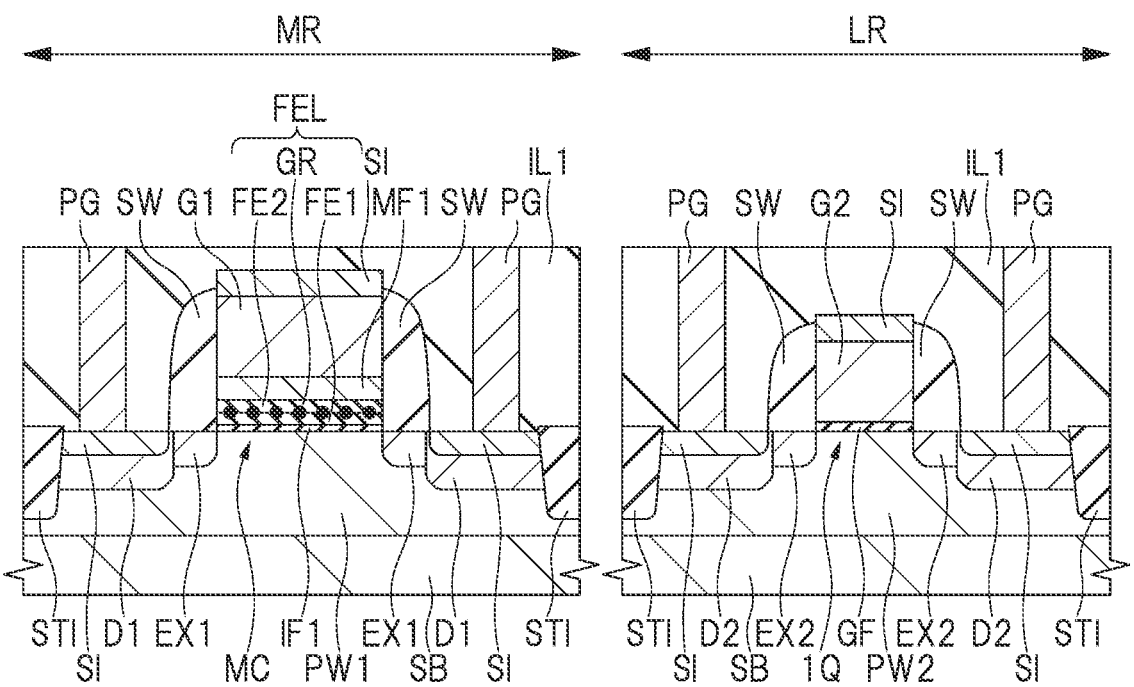
FIG. 2 is a cross-sectional view of the semiconductor device according to the first embodiment.

As shown in FIG. 2, the semiconductor device of the present embodiment includes a region MR in which the ferroelectric memory cell MC is formed and a region LR in which the low breakdown voltage MISFET 1Q is formed.

A semiconductor substrate (semiconductor wafer) SB is made of, for example, p-type single crystal silicon (Si) having a specific resistance of about 1 to 10 Ωcm. A p-type well region PW1 is formed in the semiconductor substrate SB in the region MR, and a p-type well region PW2 is formed in the semiconductor substrate SB in the region LR. In the well region PW1 and the well region PW2, a plurality of element isolation portions STI are formed. The element isolation portion STI is formed by embedding an insulating film such as a silicon oxide film in a trench formed in the semiconductor substrate SB.

First, the structure of the ferroelectric memory cell MC in the region MR will be described. In the present embodiment, a memory cell referred to as a MFIS (Metal Ferroelectric Insulator Semiconductor) structure in which a ferroelectric layer FEL is applied to a transistor structure is exemplified as the ferroelectric memory cell MC.

In the region MR, an insulating film IF1 is formed on the semiconductor substrate SB including the well region PW1. The insulating film IF1 is, for example, a silicon oxide film and has a thickness of, for example, 1 nm to 3 nm. The insulating film IF1 is provided for the purpose of stabilizing the interface between the semiconductor substrate SB and the ferroelectric layer FEL to be described later or for the purpose of preventing electrons from entering the ferroelectric layer FEL from the semiconductor substrate SB when a voltage is applied to a gate electrode G1 to be described later at the time of operating the ferroelectric memory cell MC. Therefore, if these purposes can be achieved, the insulating film IF1 may not be provided in some cases.

The ferroelectric layer FEL is formed on the insulating film IF1. The ferroelectric layer FEL includes a ferroelectric film FE1, a ferroelectric film FE2, and a plurality of grains GR formed between the ferroelectric film FE1 and the ferroelectric film FE2.

Each of the ferroelectric film FE1 and the ferroelectric film FE2 is made of a metal oxide film, and is, for example, a high dielectric constant film having a dielectric constant higher than that of a silicon nitride film. Also, a thickness of each of the ferroelectric film FE1 and the ferroelectric film FE2 is, for example, nm. In this case, a thickness of the ferroelectric layer FEL is, for example, 10 nm.

In addition, each of the ferroelectric film FE1 and the ferroelectric film FE2 is an insulating film made of a substance which causes dielectric polarization when an electric field is applied and whose polarization does not become zero even when the electric field is removed, that is, a ferroelectric material. Namely, polarization remains in the ferroelectric film FE1 and the ferroelectric film FE2 even in a state in which no electric field is applied. The ferroelectric material is a substance in which electric dipoles are aligned even if there is no electric field outside and the direction of dipoles can be changed by an electric field.

Also, each of the ferroelectric film FE1 and the ferroelectric film FE2 needs to be an orthorhombic crystal. In other words, the film mainly composed of crystals other than the orthorhombic crystal is a paraelectric film. Therefore, in the ferroelectric memory cell MC, in order to realize the increase in remaining polarization of the ferroelectric layer FEL, the improvement in performance as a ferroelectric material, and the reduction in driving power of the ferroelectric memory cell MC, crystals constituting the dielectric film FE1 and the ferroelectric film FE2 need to be formed of orthorhombic crystals as much as possible.

In the present embodiment, each of the ferroelectric film FE1 and the ferroelectric film FE2 is an insulating film made of, for example, a material containing hafnium (Hf), oxygen (O), and zirconium (Zr) as a first element. The first element may be any one of silicon (Si), germanium (Ge), yttrium (Y), lanthanum (La) and ytterbium (Yb) instead of zirconium.

The plurality of grains GR are formed as a part of the ferroelectric layer FEL between the ferroelectric film FE1 and the ferroelectric film FE2. As described later, the plurality of grains GR function as crystal nuclei for making the ferroelectric film FE1 and the ferroelectric film FE2 into orthorhombic crystals in the manufacturing process of the ferroelectric layer FEL. Therefore, the plurality of grains GR are composed of a plurality of grains separated from each other. In other words, the plurality of grains GR are not a film that is continuously formed like the ferroelectric film FE1 and the ferroelectric film FE2, but are formed discontinuously. If each of the plurality of grains GR is coupled to be formed as a film, the function of the plurality of grains GR as crystal nuclei is degraded.

The plurality of grains GR contain a second element different from any of hafnium, oxygen and the first element. The second element is, for example, aluminum (Al). Also, the second element may be anyone of carbon (C), nitrogen (N), fluorine (F) and titanium (Ti) instead of aluminum. In the present embodiment, each of the plurality of grains GR is composed of one atom or an aggregate of 2 to 4 atoms.

Also, in some cases, the plurality of grains GR are bonded to a substance contained in the ferroelectric film FE1 and the ferroelectric film FE2 in the vicinity of the interface between the ferroelectric film FE1 and the ferroelectric film FE2 in the manufacturing process of the ferroelectric layer FEL. Namely, the plurality of grains GR are ultimately any one of aluminum, carbon, nitrogen, fluorine, titanium, and a compound in which these are bonded with hafnium, oxygen or the first element.

FIG. 3 is a graph obtained by experiments conducted by an inventor of this application, in which the vertical axis represents the concentration of the plurality of grains GR and the horizontal axis represents the thickness in the ferroelectric layer FEL in the film thickness direction. Here, measurement results in the case in which aluminum (Al) is used as the plurality of grains GR are shown. In FIG. 3, the solid line indicates the concentration of aluminum (Al) and the dot and dash line indicates the concentration of hafnium (Hf). Note that FIG. 3 shows not only the graph of the first embodiment but also the graph of the second embodiment to be described later.

Referring to the graph of the first embodiment in FIG. 3, the concentration peak of aluminum (Al) is high in the vicinity of the interface between the ferroelectric film FE1 and the ferroelectric film FE2 in the ferroelectric layer FEL. Also, the concentration peak of aluminum (Al) is low or the concentration peak of aluminum (Al) is not present in the vicinity of the lower surface of the ferroelectric film FE1 and in the vicinity of the upper surface of the ferroelectric film FE2. Therefore, it turns out that a part of aluminum is present in the ferroelectric film FE1 and in the ferroelectric film FE2, but most of aluminum is present in the vicinity of the interface between the ferroelectric film FE1 and the ferroelectric film FE2. As described above, aluminum and a compound in which aluminum and the substance contained in the ferroelectric film FE1 and the ferroelectric film FE2 are bonded are present in the vicinity of the interface between the ferroelectric film FE1 and the ferroelectric film FE2. Namely, it turns out that aluminum or the aluminum compound does not diffuse throughout the ferroelectric film FE1 and the ferroelectric film FE2 and remains in the vicinity of the interface between the ferroelectric film FE1 and the ferroelectric film FE2.

As described above, the concentration peak of the plurality of grains GR is higher at the position close to the interface between the ferroelectric film FE1 and the ferroelectric film FE2 than those at the position close to the lower surface of the ferroelectric film FE1 and at the position close to the upper surface of the ferroelectric film FE2. Therefore, since the plurality of grains GR are present in the vicinity of the interface between the ferroelectric film FE1 and the ferroelectric film FE2, each of the ferroelectric film FE1 and the ferroelectric film FE2 has a highly uniform crystal grain size and is easily formed as an orthorhombic crystal. Accordingly, when the ferroelectric layer FEL is applied to the ferroelectric memory cell MC, it is possible to suppress the problem of the increase in the variation in the threshold voltage due to the polarization inversion of the ferroelectric layer FEL, so that the problem of the decrease in the rewrite endurance of the ferroelectric memory cell MC or the decrease in the retention can be suppressed. Namely, the performance of the semiconductor device can be improved by the technique of the present embodiment.

In addition, when comparing a ratio of hafnium, a ratio of the first element (Zr or others) and a ratio of the second element (grain GR) in the ferroelectric layer FEL, the ratio of the second element is smaller than the ratio of hafnium and the ratio of the first element. Specifically, when the sum of the ratio of hafnium, the ratio of the first element and the ratio of the second element is 100%, the ratio of hafnium is within the range of 30% to 50%, the ratio of the first element is within the range of 30% to 50%, and the ratio of the second element is within the range of 0.5% to 5.0% in the ferroelectric layer FEL.

A metal film MF1 is formed on the ferroelectric layer FEL. The metal film MF1 is a conductive film made of, for example, a titanium nitride film, a tantalum nitride film, or a tungsten film. A thickness of the metal film MF1 is, for example, 10 nm to 20 nm. The metal film MF1 is a cap film provided to apply a stress to the ferroelectric film FE1 and the ferroelectric film FE2 and control the orientation of crystal of each of the ferroelectric film FE1 and the ferroelectric film FE2 in the manufacturing process of the ferroelectric layer FEL. Therefore, in the case in which the ferroelectric film FE1 and the ferroelectric film FE2 can exist as orthorhombic crystals after forming the ferroelectric layer FEL, the metal film MF1 may be removed. However, since the orientation of crystal of each of the ferroelectric film FE1 and the ferroelectric film FE2 may vary due to the removal of the metal film MF1, it is more preferable to leave the metal film MF1 without being removed. In the case in which the metal film MF1 is left, the metal film MF1 functions also as a part of the gate electrode G1 described later.

The gate electrode G1 is formed on the metal film MF1. The gate electrode G1 is a conductive film made of, for example, a polycrystalline silicon film into which an n-type impurity is introduced. Instead of the polycrystalline silicon film, a metal film such as a titanium nitride film, an aluminum film or a tungsten film or a stacked film obtained by appropriately stacking these films may be used as the material constituting the gate electrode G1.

A sidewall spacer SW is formed on a side surface of the gate electrode G1. The sidewall spacer SW is formed of, for example, a stacked film of a silicon oxide film and a silicon nitride film.

In the well region PW1 below the sidewall spacer SW, an extension region EX1 which is a low concentration n-type impurity region is formed. Also, in the well region PW1 at a position aligned with the sidewall spacer SW, a diffusion region D1 which is an n-type impurity region having a higher concentration than that of the extension region EX1 is formed. The extension region EX1 and the diffusion region D1 are connected to each other and constitute a part of a source region or a part of a drain region of the ferroelectric memory cell MC.

A silicide layer SI made of, for example, cobalt silicide ($CoSi_2$), nickel silicide (NiSi) or nickel platinum silicide (NiPtSi) is formed on the gate electrode G1 and on the diffusion region D1. The silicide layer SI is formed mainly for reducing the contact resistance with a plug PG described later.

Next, a structure of the low breakdown voltage MISFET 1Q in the region LR will be described.

In the region LR, a gate insulating film GF is formed on the semiconductor substrate SB including the well region PW2. The gate insulating film GF is, for example, a silicon oxide film and has a thickness of, for example, 1 nm to 4 nm.

On the gate insulating film GF, a gate electrode G2 is formed. The gate electrode G2 is a conductive film made of, for example, a polycrystalline silicon film into which an n-type impurity is introduced. Instead of the polycrystalline silicon film, a metal film such as a titanium nitride film, an aluminum film or a tungsten film or a stacked film obtained by appropriately stacking these films may be used as the material constituting the gate electrode G2.

A sidewall spacer SW is formed on a side surface of the gate electrode G2. The sidewall spacer SW is formed of, for example, a stacked film of a silicon oxide film and a silicon nitride film.

In the well region PW2 below the sidewall spacer SW, an extension region EX2 which is a low concentration n-type impurity region is formed. Also, in the well region PW2 at a position aligned with the sidewall spacer SW, a diffusion region D2 which is an n-type impurity region having a higher concentration than that of the extension region EX2 is formed. The extension region EX2 and the diffusion region D2 constitute a part of a source region or a part of a drain region of the MISFET 1Q.

Note that the impurity concentration of the extension region EX1 in the region MR is substantially the same as the impurity concentration of the extension region EX2 in the region LR. In addition, the impurity concentration of the diffusion region D1 in the region MR is substantially the same as the impurity concentration of the diffusion region D2 in the region LR.

A silicide layer SI made of, for example, cobalt silicide ($CoSi_2$), nickel silicide (NiSi) or nickel platinum silicide (NiPtSi) is formed on the gate electrode G2 and on the diffusion region D2. The silicide layer SI is formed mainly for reducing the contact resistance with a plug PG described later.

An interlayer insulating film IL1 is formed on the ferroelectric memory cell MC formed in the region MR and on the MISFET 1Q formed in the region LR. The interlayer insulating film IL1 is, for example, a silicon oxide film. A plurality of contact holes are formed in the interlayer insulating film IL1, and a plurality of plugs PG are formed in the plurality of contact holes. The plug PG is composed of, for example, a barrier metal film made of a titanium film, a titanium nitride film or a stacked film thereof and a conductive film mainly made of tungsten. The plug PG is electrically connected to the diffusion region D1 or the diffusion region D2 via the silicide layer SI. Although not shown, plugs PG electrically connected to the gate electrode G1 and the gate electrode G2 are also present in the interlayer insulating film IL1.

Although not shown, a plurality of wirings are formed on the plugs PG. For example, an interlayer insulating film is formed on the interlayer insulating film IL1, and trenches for wiring are formed in this interlayer insulating film. Then, a conductive film containing, for example, copper as a main component is buried in the wiring trenches, so that first layer wirings connected to the plugs PG are formed.

<Operation of Ferroelectric Memory Cell MC>

Next, an operation example of the ferroelectric memory cell MC will be described with reference to FIG. 4.

FIG. 4 is a table showing an example of applied voltage to each portion of a selected memory cell in the ferroelectric memory cell MC at the time of "writing", "erasing" and "reading". The table of FIG. 4 describes a voltage Vd applied to the drain region (one diffusion region D1) of the ferroelectric memory cell MC shown in FIG. 2, a voltage Vg applied to the gate electrode G1 thereof, a voltage Vs applied to the source region (the other diffusion region D1) thereof, and a voltage Vb applied to the well region PW1 at the time of the respective operations of "writing", "erasing" and "reading". Note that conditions described in the table of FIG. 4 are a preferable example of the voltage application conditions, and the conditions are not limited thereto, and various modifications are possible as necessary.

In the present embodiment, the state in which the polarization of the ferroelectric layer FEL is directed upward and the threshold voltage of the ferroelectric memory cell MC is relatively high is defined as "writing". Also, the state in which the polarization of the ferroelectric layer FEL is directed downward and the threshold voltage of the ferroelectric memory cell MC is relatively low is defined as "erasing".

In the writing operation, a negative voltage is applied to the gate electrode G1. Namely, for example, voltages as shown in the column of "writing" in FIG. 4 are applied to each portion of the selected memory cell to which writing is performed. As a result, the polarization of the ferroelectric layer FEL is directed upward, the threshold voltage of the ferroelectric memory cell MC rises, and the ferroelectric layer FEL is in a write state.

In the erasing operation, a positive voltage is applied to the gate electrode G1. Namely, for example, voltages as shown in the column of "erasing" in FIG. 4 are applied to each portion of the selected memory cell to which erasing is performed. As a result, the polarization of the ferroelectric layer FEL is directed downward, the threshold voltage of the ferroelectric memory cell MC is lowered, and the ferroelectric layer FEL is in an erase state.

In the reading operation, for example, voltages as shown in the column of "reading" in FIG. 4 are applied to each portion of the selected memory cell from which reading is performed. By setting the voltage Vg applied to the gate electrode G1 to a value between the threshold voltage of the ferroelectric layer FEL in the write state and the threshold voltage of the ferroelectric layer FEL in the erase state, the write state and the erase state can be discriminated.

<Manufacturing Process of Semiconductor Device>

Hereinafter, a method of manufacturing the semiconductor device according to the present embodiment will be described with reference to FIGS. 5 to 17. Each of FIGS. 5 to 17 is a cross-sectional view showing the region MR in which the ferroelectric memory cell MC is formed and the region LR in which the low breakdown voltage MISFET 1Q is formed.

Figure 5:
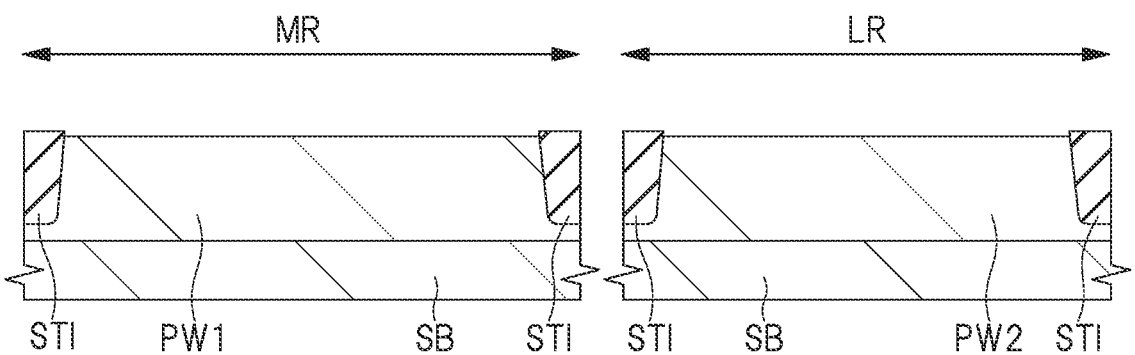
FIG. 5 is a cross-sectional view showing a manufacturing process of the semiconductor device according to the first embodiment.

FIG. 5 shows a step of forming the element isolation portion STI, the well region PW1, and the well region PW2.

First, the semiconductor substrate SB made of, for example, single crystal silicon into which a p-type impurity is introduced is prepared. Next, trenches are formed in the semiconductor substrate SB by using a photolithography method and an etching process. Then, an insulating film such as a silicon oxide film is formed so as to fill the trenches, and thereafter, the insulating film outside the trenches is removed by the CMP (Chemical Mechanical Polishing) method, whereby the element isolation portions STI composed of the insulating film left in the trenches are formed.

Next, by introducing an impurity into the semiconductor substrate SB by using a photolithography method and an ion implantation method, the p-type well region PW1 is formed in the region MR and the p-type well region PW2 is formed in the region LR.

Figure 6:
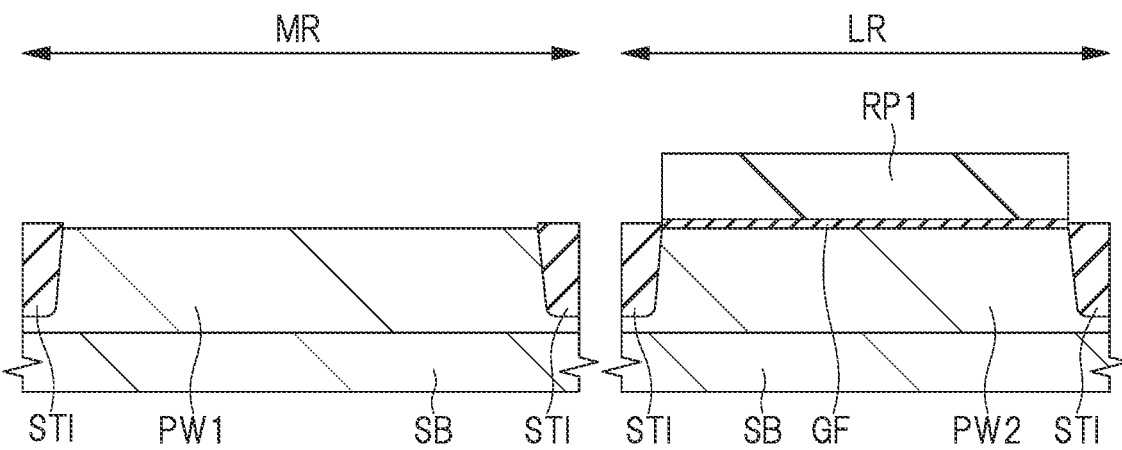
FIG. 6 is a cross-sectional view showing the manufacturing process of the semiconductor device continued from FIG. 5.

FIG. 6 shows a step of forming the gate insulating film GF.

First, for example, heat treatment is performed on the semiconductor substrate SB including the well region PW1 in the region MR and the well region PW2 in the region LR in an atmosphere containing oxygen, so that the gate insulating film GF made of, for example, silicon oxide is formed on the semiconductor substrate SB in the region MR and the region LR. A thickness of the gate insulating film GF is, for example, 1 nm to 3 nm. Next, a resist pattern RP1 having a pattern that opens the region MR and covers the region LR is formed. Next, etching process is performed with using the resist pattern RP1 as a mask, thereby removing the gate insulating film GF in the region MR so that the gate insulating film GF in the region LR is left. Thereafter, the resist pattern RP1 is removed by, for example, asking process.

Figure 7:
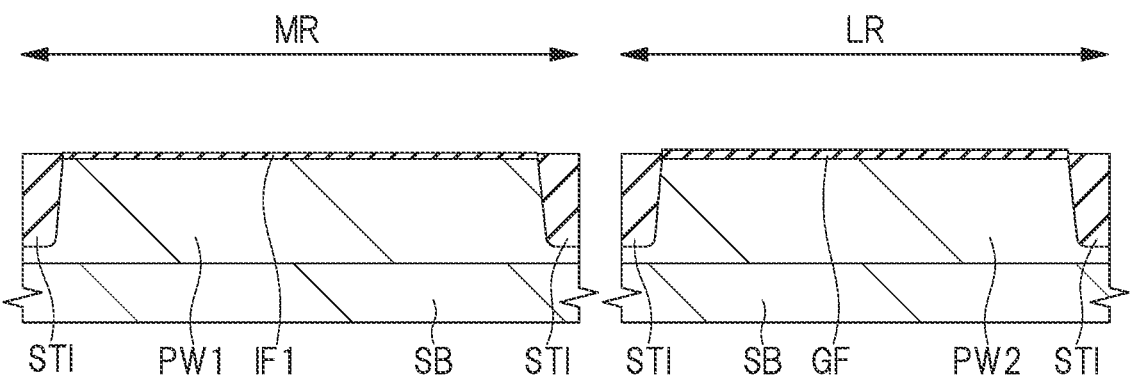
FIG. 7 is a cross-sectional view showing the manufacturing process of the semiconductor device continued from FIG. 6.

FIG. 7 shows a step of forming the insulating film IF1.

For example, heat treatment is performed on the semiconductor substrate SB in an atmosphere containing oxygen, so that the insulating film IF1 made of, for example, silicon oxide is formed on the semiconductor substrate SB in the region MR. A thickness of the insulating film IF1 is, for example, 1 nm to 3 nm. At this time, the gate insulating film GF is formed in the region LR, and the thickness of the gate insulating film GF slightly increases due to this thermal oxidation process.

Figure 8:
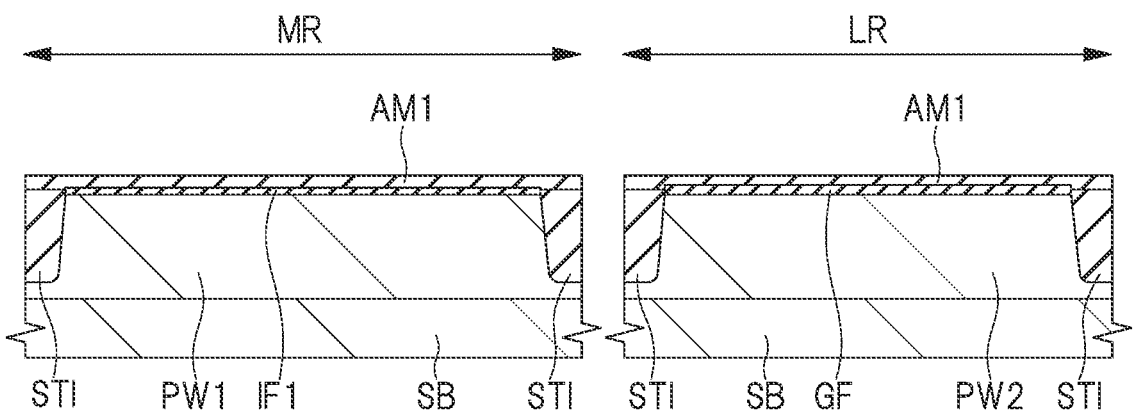
FIG. 8 is a cross-sectional view showing the manufacturing process of the semiconductor device continued from FIG. 7.

FIG. 8 shows a step of forming the amorphous film AM1.

The amorphous film AM1 is formed on the insulating film IF1 in the region MR and on the gate insulating film GF in the region LR by, for example, the ALD (Atomic Layer Deposition) method. A thickness of the amorphous film AM1 is, for example, 5 nm. The amorphous film AM1 is a film made of a material containing, for example, hafnium (Hf), oxygen (O), and zirconium (Zr) as the first element. In addition, the first element may be any one of silicon (Si), germanium (Ge), yttrium (Y), lanthanum (La) and ytterbium (Yb) instead of zirconium.

Figure 9:
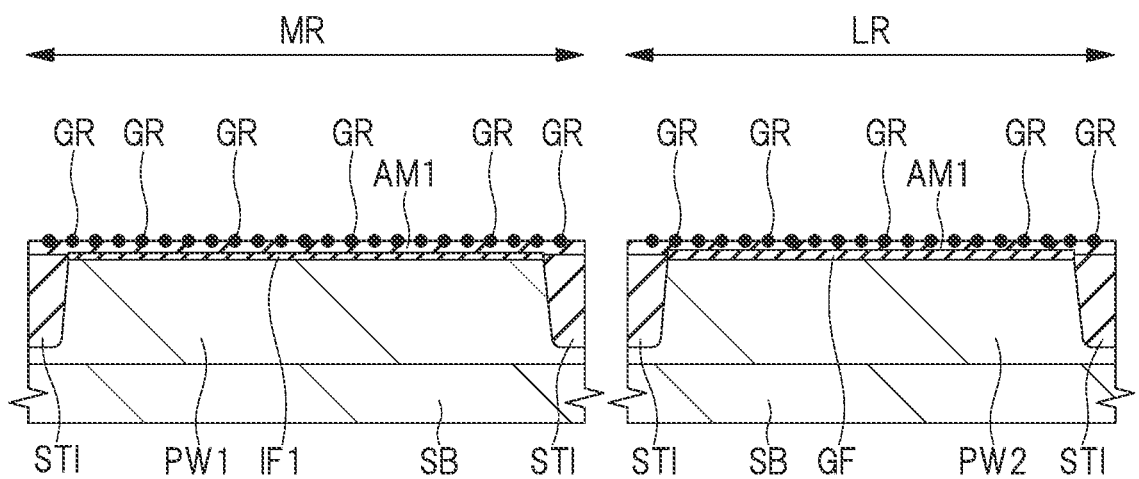
FIG. 9 is a cross-sectional view showing the manufacturing process of the semiconductor device continued from FIG. 8.

FIG. 9 shows a step of forming the plurality of grains GR.

After the semiconductor wafer is transferred to another apparatus from the ALD apparatus used in the step of forming the amorphous film AM1 of FIG. 8, a step of FIG. 9 is carried out. In the present embodiment, in the regions MR and LR, the plurality of grains GR are formed on the amorphous film AM1 by the sputtering method. The plurality of grains GR are separated from each other. In other words, the plurality of grains GR are not the film formed continuously like the amorphous film AM1, but are formed discontinuously. Namely, the plurality of grains GR do not cover the entire amorphous film AM1 but are dotted on the amorphous film AM1. Therefore, a part of the amorphous film AM1 is covered with the plurality of grains GR, and the other part of the amorphous film AM1 is exposed from the plurality of grains GR. Also, some of the plurality of grains GR are deposited on an upper surface of the amorphous film AM1, and others of the plurality of grains GR are introduced in the upper surface of the amorphous film AM1. Therefore, in the step of crystallizing the amorphous film AM1 and the like to be described later, the plurality of grains GR can function as crystal nuclei.

In addition, the plurality of grains GR contain a second element different from any of hafnium, oxygen and the first element. The second element is, for example, aluminum (Al). In addition, the second element may be any one of carbon (C), nitrogen (N), fluorine (F) and titanium (Ti) instead of aluminum. In the present embodiment, a case in which the second element is aluminum will be described as a representative example.

Also, the plurality of grains GR may be formed by the CVD (Chemical Vapor Deposition) method instead of the sputtering method, but since it is preferable to form the plurality of grains GR so as to be separated from each other as described above, it is preferable to form the plurality of grains GR by the sputtering method. In addition, a surface density of the plurality of grains GR with respect to the upper surface of the amorphous film AM1 is within the range of $5\times10^{12}/cm^2$ to $5\times10^{14}/cm^2$. Accordingly, it is possible to precisely control the radius of the crystal grain size of the plurality of grains GR within the range of, for example, 0.1 nm to 1 nm.

Further, in order to prevent the plurality of grains GR from diffusing too much into the amorphous film AM1, the sputtering method is preferably performed at a temperature in the range of 1° C. or higher and 150° C. or lower.

Further, as described above, the second element constituting the plurality of grains GR may be replaced with another element in place of aluminum. In such a case, the plurality of grains GR can be formed by the ion implantation method instead of the sputtering method. When the ion implantation method is used, the dose amount of the plurality of grains GR is set within the range of $5\times10^{12}/cm^2$ to $5\times10^{14}/cm^2$.

Figure 10:
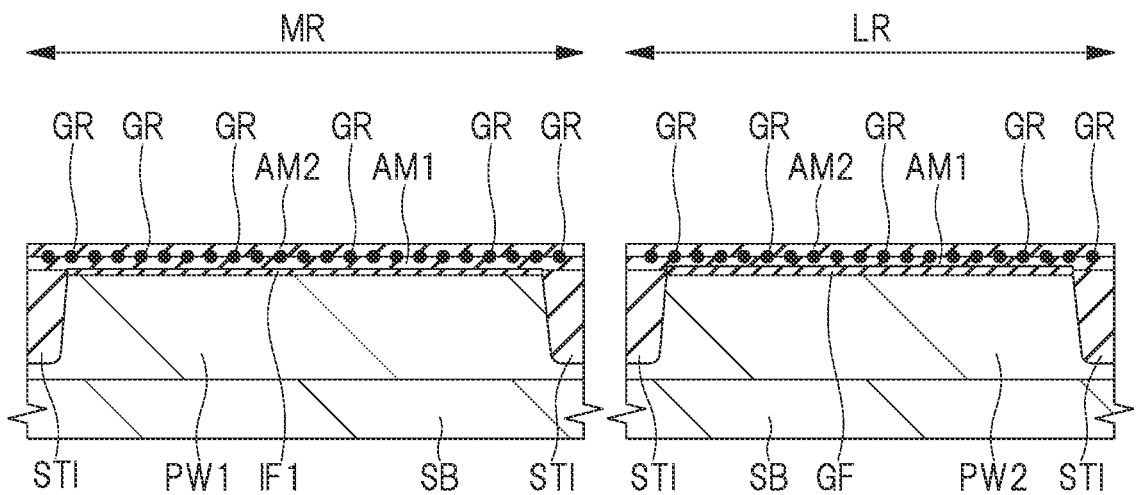
FIG. 10 is a cross-sectional view showing the manufacturing process of the semiconductor device continued from FIG. 9.

FIG. 10 shows a step of forming an amorphous film AM2.

In the region MR and the region LR, the amorphous film AM2 is formed on the plurality of grains GR and on the amorphous film AM1 by, for example, the ALD method. Through this step, the plurality of grains GR are covered with the amorphous film AM2. A thickness of the amorphous film AM2 is, for example, 5 nm. The amorphous film AM2 is made of the same material as the amorphous film AM1, and is a film made of a material containing, for example, hafnium (Hf), oxygen (O), and zirconium (Zr) as the first element. In addition, the first element may be any one of silicon (Si), germanium (Ge), yttrium (Y), lanthanum (La) and ytterbium (Yb) instead of zirconium.

Figure 11:
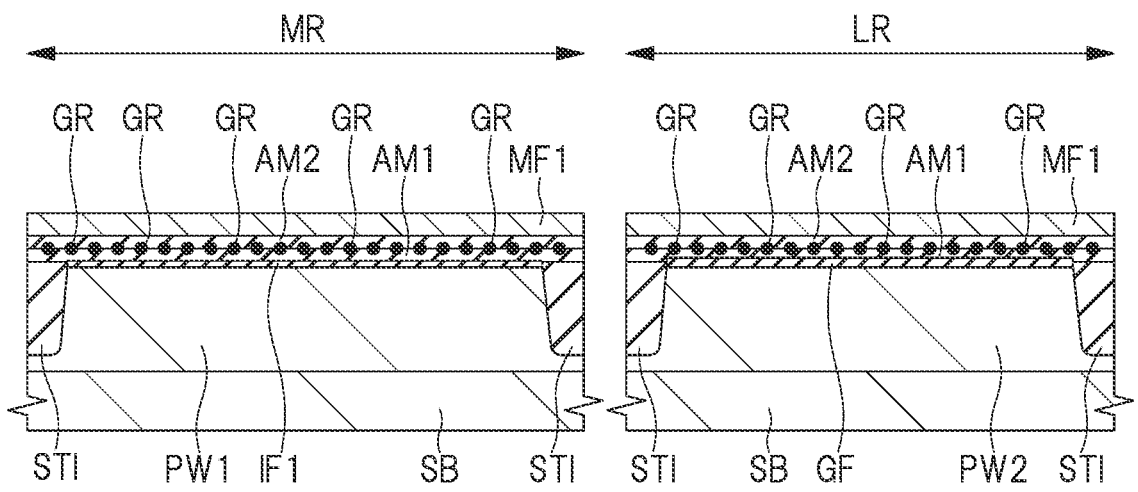
FIG. 11 is a cross-sectional view showing the manufacturing process of the semiconductor device continued from FIG. 10.

FIG. 11 shows a step of forming the metal film MF1.

In the region MR and the region LR, the metal film MF1 made of, for example, titanium nitride, tantalum nitride, or tungsten is formed on the amorphous film AM2 by using, for example, the CVD method or the sputtering method. A thickness of the metal film MF1 is, for example, 10 nm to 20 nm. The metal film MF1 is provided mainly for applying stress to the amorphous film AM1 and the amorphous film AM2.

Figure 12:
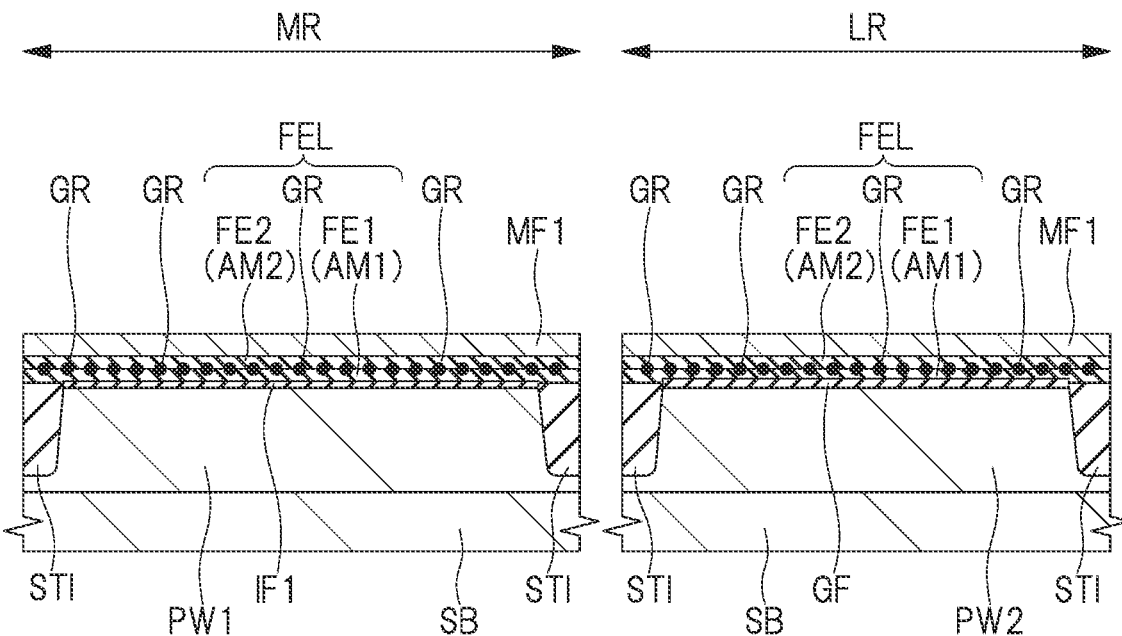
FIG. 12 is a cross-sectional view showing the manufacturing process of the semiconductor device continued from FIG. 11.

FIG. 12 shows a step of forming the ferroelectric film FE1, the ferroelectric film FE2, and the ferroelectric layer FEL.

In the region MR and the region LR, by performing heat treatment in a state in which the metal film MF1 is formed on the amorphous film AM2, the amorphous film AM1 is crystallized to form the ferroelectric film FE1 which is an orthorhombic crystal and the amorphous film AM2 is crystallized to form the ferroelectric film FE2 which is an orthorhombic crystal.

This heat treatment can be carried out at a temperature of 600° C. or lower by the RTA (Rapid Thermal Annealing) method, but it is preferable to perform the heat treatment by using a microwave of a frequency of, for example, 1 GHz to 10 GHz as the electromagnetic wave, and it is more preferable to perform the heat treatment by using a microwave of a frequency of 2.45 GHz. The heat treatment using the microwave is capable of crystallization at a lower temperature, and can be performed at a temperature of, for example, 400° C. or lower.

In the heat treatment using the microwave, the microwave is irradiated so that the vibration direction of the electric field is 90 degrees (vertical) with respect to the upper surface of the metal film MF1 or the upper surface of the semiconductor substrate SB. The electromagnetic wave such as the microwave described above has the characteristic that the ferroelectric film FE1 and the ferroelectric film FE2 which are polarized crystals are easily formed because energy is absorbed by the polarized crystals. Therefore, it becomes easy to perform the heat treatment for crystallization at a low temperature of 400° C. or lower as described above.

For example, if the heat treatment for crystallization is performed at a high temperature of about 700 to 1000° C., the crystal phases of the ferroelectric film FE1 and the ferroelectric film FE2 are likely to be monoclinic, and the ferroelectric film FE1 and the ferroelectric film FE2 become paraelectric films instead of ferroelectric films. By performing the heat treatment at a low temperature of 400° C. or lower as in the present embodiment, it becomes easy to form the ferroelectric film FE1 and the ferroelectric film FE2 as orthorhombic crystals.

In addition, in this crystallization step, the orientation of each of the ferroelectric film FE1 and the ferroelectric film FE2 is controlled by the stress from the metal film MF1. Namely, the metal film MF1 has a function to orient the crystal phase of each of the ferroelectric film FE1 and the ferroelectric film FE2 to be orthorhombic when the amorphous film AM1 and the amorphous film AM2 are crystallized into the ferroelectric film FE1 and the ferroelectric film FE2.

Further, in the present embodiment, the plurality of grains GR are formed as a plurality of grains between the amorphous film AM1 and the amorphous film AM2. The plurality of grains function as crystal nuclei in the crystallization step. As a result of the above-described heat treatment, some of the plurality of grains GR are bonded with substances contained in the amorphous film AM1 and the amorphous film AM2 to become compounds. Namely, the plurality of grains GR after the heat treatment are any one of aluminum, carbon, nitrogen, fluorine and titanium, or a compound in which these are bonded with hafnium, oxygen or the first element described above.

Hereinafter, a case in which the second element constituting the plurality of grains GR is aluminum will be described as an example of the crystallization step. Most of the plurality of aluminum grains which are the plurality of grains GR are bonded with oxygen contained in the amorphous film AM1 and the amorphous film AM2 to be a plurality of aluminum oxide grains. The amorphous film AM1 and the amorphous film AM2 are crystallized with using the plurality of aluminum oxide grains as crystal nuclei to be the ferroelectric film FE1 and the ferroelectric film FE2. Here, a radius of the crystal grain size of the plurality of aluminum grains is precisely controlled within the range of, for example, 0.1 nm to 1 nm. Namely, since the crystal grain size of each of the ferroelectric film FE1 and the ferroelectric film FE2 is aligned in accordance with the crystal grain size of the plurality of aluminum oxide grains, uniformity of the crystal grain size in the ferroelectric layer FEL is improved.

As described above, in the ferroelectric layer FEL, the uniformity of the crystal grain size can be improved and the orientation of the crystal can be aligned to be orthorhombic. Therefore, when the ferroelectric layer FEL is applied to the ferroelectric memory cell MC, it is possible to suppress the problem that the film quality of the ferroelectric layer FEL deteriorates due to polarization inversion of the ferroelectric layer FEL and the variation in the threshold voltage increases due to the variations in the crystal grain size and crystal orientation of the ferroelectric layer FEL. Accordingly, the problem of the decrease in the rewrite endurance of the ferroelectric memory cell MC or the decrease in the retention can be suppressed. Namely, the performance of the semiconductor device can be improved by the technique of the present embodiment.

Figure 13:
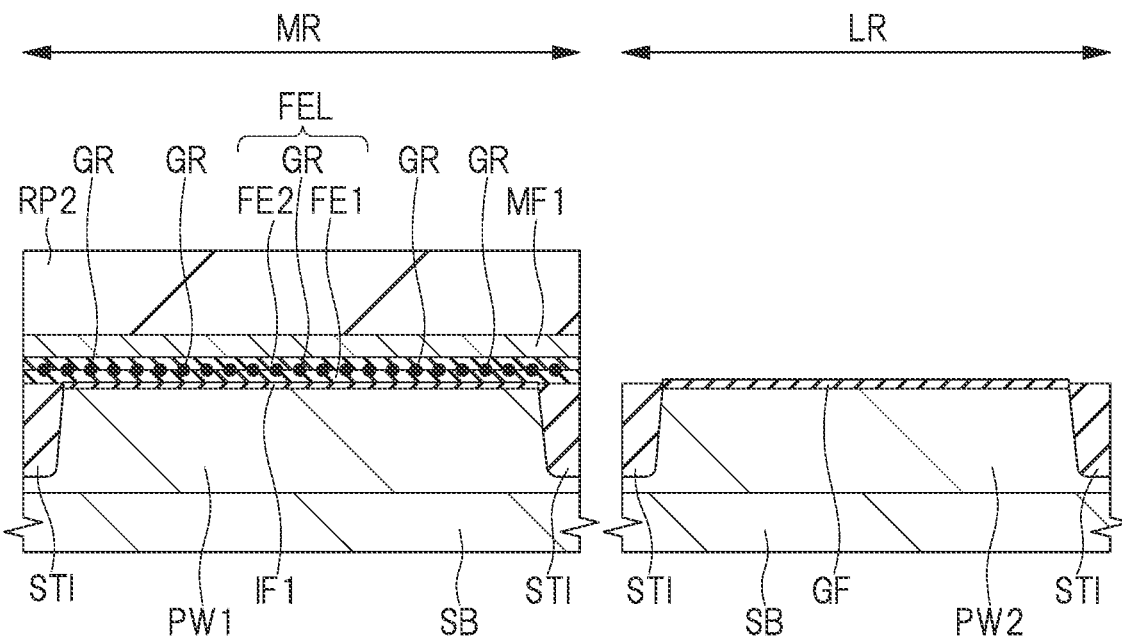
FIG. 13 is a cross-sectional view showing the manufacturing process of the semiconductor device continued from FIG. 12.

FIG. 13 shows the manufacturing process of the semiconductor device continued from FIG. 12, namely, a step of removing the metal film MF1 and the ferroelectric layer FEL.

First, a resist pattern RP2 having a pattern that opens the region LR and covers the region MR is formed. Next, etching process is performed with using the resist pattern RP2 as a mask, whereby the metal film MF1 and the ferroelectric layer FEL formed in the region LR are removed so that the metal film MF1 and the ferroelectric layer FEL formed in the region MR are left. Thereafter, the resist pattern RP2 is removed by, for example, asking process.

Figure 14:
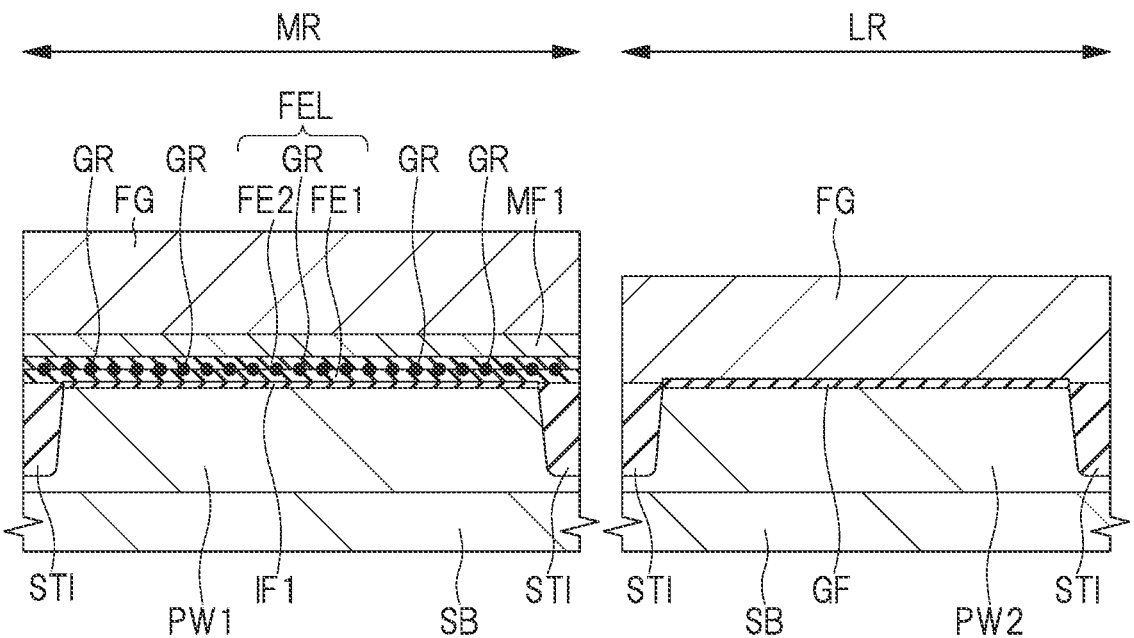
FIG. 14 is a cross-sectional view showing the manufacturing process of the semiconductor device continued from FIG. 13.

FIG. 14 shows a step of forming a conductive film FG.

The conductive film FG made of, for example, polycrystalline silicon into which an n-type impurity is introduced is formed on the metal film MF1 in the region MR and on the gate insulating film GF in the region LR by, for example, the CVD method.

As described above, if the interior of the ferroelectric layer FEL can be sufficiently maintained as an orthorhombic crystal, the metal film MF1 may be removed before the formation of the conductive film FG.

Figure 15:
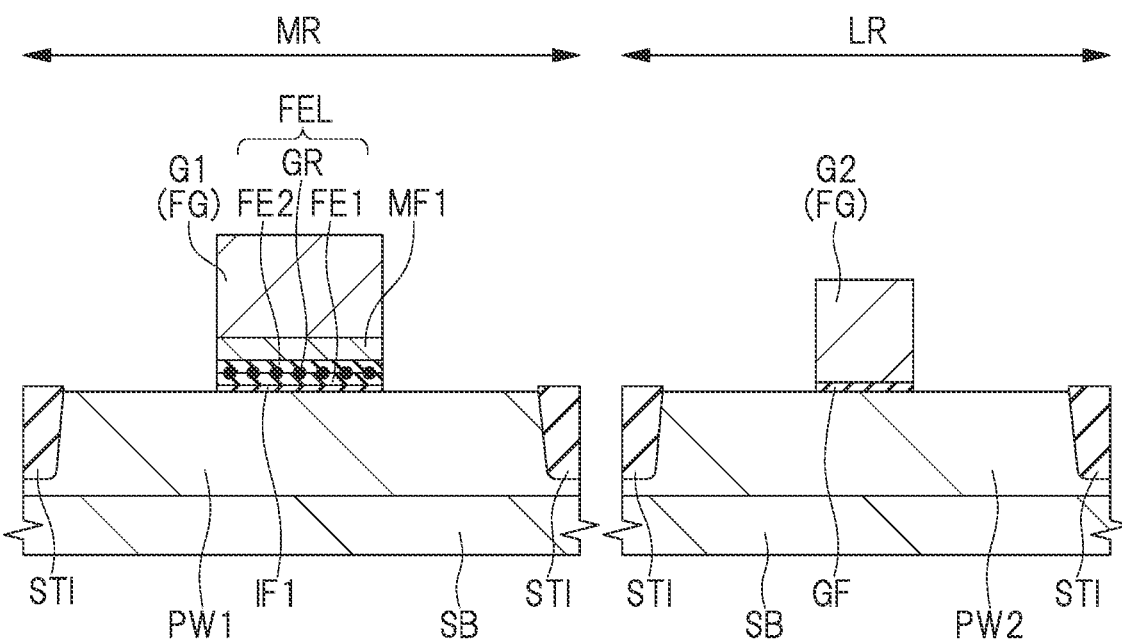
FIG. 15 is a cross-sectional view showing the manufacturing process of the semiconductor device continued from FIG. 14.

FIG. 15 shows a step of forming the gate electrode G1 and the gate electrode G2.

The conductive film FG in the regions MR and LR is patterned by a photolithography method and an etching process. Thus, the gate electrode G1 is formed in the region MR, and the gate electrode G2 is formed in the region LR. Subsequently, by performing the etching process, the metal film MF1, the ferroelectric layer FEL and the insulating film IF1 that are not covered with the gate electrode G1 are removed in the region MR, and the gate insulating film GF that is not covered with the gate electrode G2 is removed in the region LR.

Further, in the present embodiment, the case in which the metal film MF1 below the gate electrode G1 (below the conductive film FG) is left is illustrated, and thus, the metal film MF1 functions as a part of the gate electrode G1.

Figure 16:
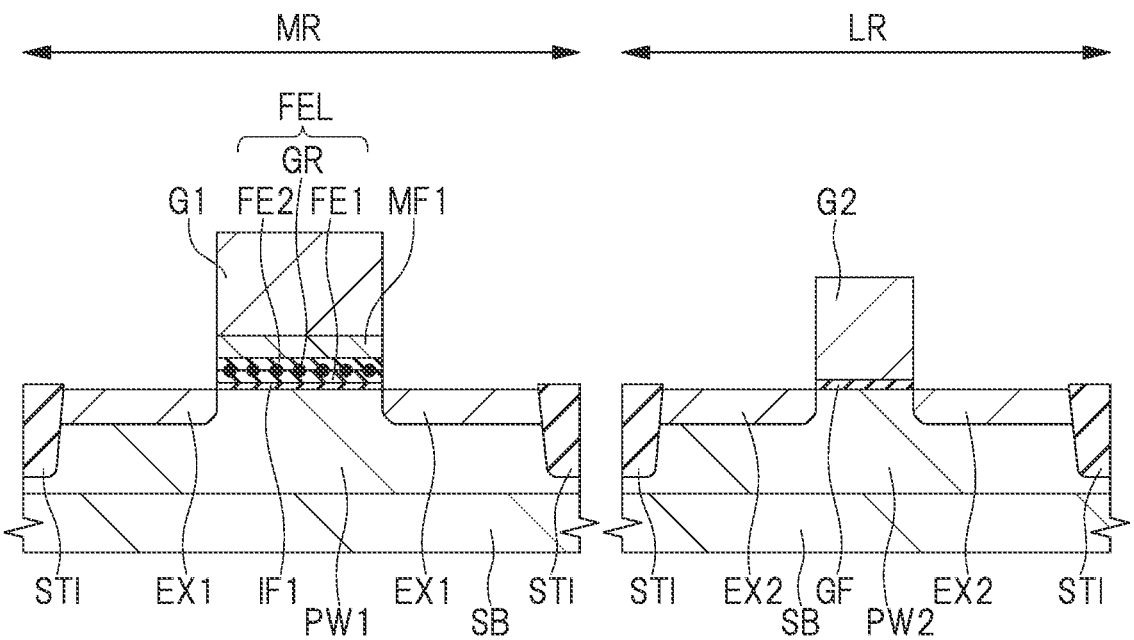
FIG. 16 is a cross-sectional view showing the manufacturing process of the semiconductor device continued from FIG. 15.

FIG. 16 shows a step of forming the extension region EX1 and the extension region EX2.

By the photolithography method and the ion implantation method, the extension region EX1 which is an n-type impurity region is formed in the well region PW1 at the position aligned with the gate electrode G1 in the region MR, and the extension region EX2 which is an n-type impurity region is formed in the well region PW2 at the position aligned with the gate electrode G2 in the region LR. The extension region EX1 constitutes a part of the source region or a part of the drain region of the ferroelectric memory cell MC, and the extension region EX2 constitutes a part of the source region or a part of the drain region of the MISFET 1Q.

Figure 17:
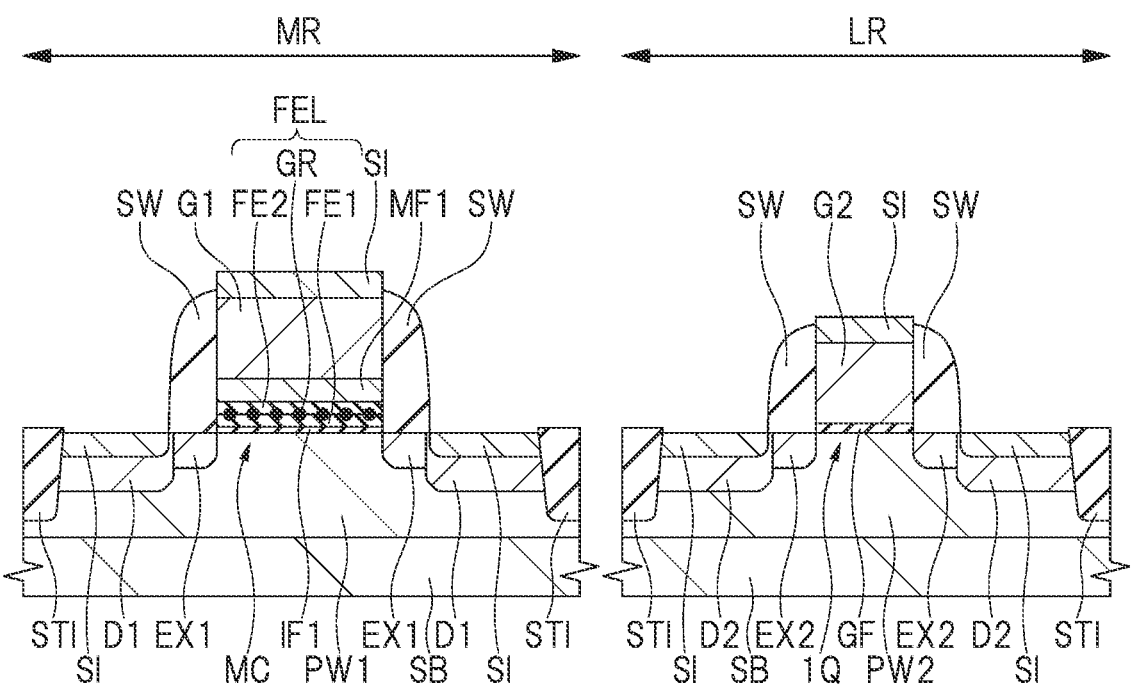
FIG. 17 is a cross-sectional view showing the manufacturing process of the semiconductor device continued from FIG. 16.

FIG. 17 shows a step of forming the sidewall spacer SW, the diffusion region D1, the diffusion region D2, and the silicide layer SI.

First, a silicon oxide film and a silicon nitride film are sequentially formed by, for example, the CVD method so as to cover the gate electrode G1 and the gate electrode G2. Next, the silicon nitride film is processed by an anisotropic etching process. Thereafter, the silicon oxide film formed on the upper surface of the gate electrode G1 and on the upper surface of the gate electrode G2 is removed. As a result, the sidewall spacers SW each composed of a stacked film of the silicon oxide film and the silicon nitride film are formed on the side surfaces of the gate electrode G1 and the gate electrode G2.

Next, by the photolithography method and the ion implantation method, the diffusion region D1 which is an n-type impurity region is formed in the well region PW1 at the position aligned with the sidewall spacer SW in the region MR, and the diffusion region D1 which is an n-type impurity region is formed in the well region PW2 at the position aligned with the sidewall spacer SW in the region LR.

In the region MR, the diffusion region D1 has an impurity concentration higher than that of the extension region EX1 and is connected to the extension region EX1 to constitute a part of the source region or a part of the drain region of the ferroelectric memory cell MC.

In the region LR, the diffusion region D2 has an impurity concentration higher than that of the extension region EX2 and is connected to the extension region EX2 to constitute a part of the source region or a part of the drain region of the MISFET 1Q.

Next, the low resistance silicide layer SI is formed on each of the upper surfaces of the diffusion region D1, the diffusion region D2, the gate electrode G1 and the gate electrode G2 by the salicide (Self Aligned Silicide) technique.

Specifically, the silicide layer SI can be formed as follows. First, a metal film for forming the silicide layer SI is formed so as to cover the region MR and the region LR. This metal film is made of, for example, cobalt, nickel or a nickel platinum alloy. Next, the semiconductor substrate SB is subjected to a first heat treatment at about 300 to 400° C., and then subjected to a second heat treatment at about 600 to 700° C., thereby reacting the materials contained in the diffusion region D1, the diffusion region D2, the gate electrode G1 and the gate electrode G2 with the metal film. As a result, the silicide layer SI made of cobalt silicide ($CoSi_2$), nickel silicide (NiSi) or nickel platinum silicide (NiPtSi) is formed on each of the upper surfaces of the diffusion region D1, the diffusion region D2, the gate electrode G1 and the gate electrode G2. Thereafter, the unreacted metal film is removed.

Also, in the case in which a metal film such as a titanium nitride film, an aluminum film or a tungsten film or a stacked film in which these are appropriately stacked is adopted as the material constituting the gate electrode G1, the polycrystalline silicon film which is the material of the gate electrode G1 can be replaced with the metal film or the stacked film by using the so-called gate last process after the step of FIG. 17.

As described above, the ferroelectric memory cell MC having the MFIS structure is formed in the region MR, and the MISFET 1Q is formed in the region LR.

Thereafter, through the steps mentioned below, the structure shown in FIG. 2 is obtained.

First, the interlayer insulating film IL1 made of, for example, silicon oxide is formed by, for example, the CVD method so as to cover the ferroelectric memory cell MC formed in the region MR and the MISFET 1Q formed in the region LR. Next, by using the photolithography method and the etching process, a plurality of contact holes are formed in the interlayer insulating film IL'. Then, a barrier metal film made of, for example, a titanium film, a titanium nitride film, or a stacked film thereof is formed in the plurality of contact holes, and a conductive film mainly made of tungsten is formed on the barrier metal film. Next, by removing the barrier metal film and the conductive film outside the contact holes by, for example, the CMP method, the plugs PG are formed in the contact holes. The plug PG is electrically connected to the diffusion region D1 or the diffusion region D2 via the silicide layer SI. Although not shown, the plugs PG electrically connected to the gate electrode G1 and the gate electrode G1 are also present.

<Comparison between Studied Example and Present Embodiment>

Figure 24:
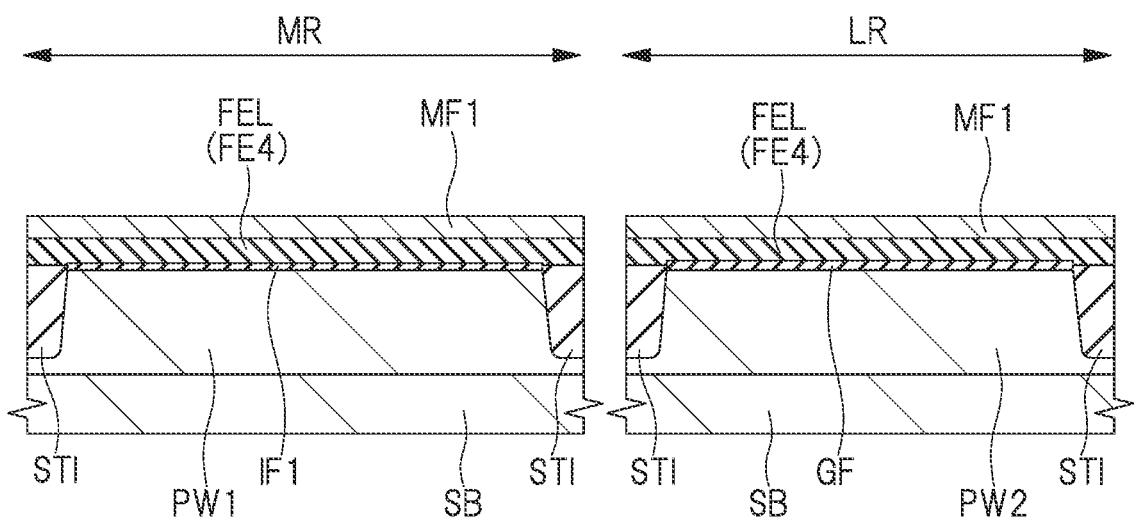
FIG. 24 is a cross-sectional view showing a manufacturing process of a semiconductor device according to a studied example.

FIG. 24 shows a semiconductor device according to a studied example studied by an inventor of this application, and is a cross-sectional view in a manufacturing process corresponding to FIG. 12 of the present embodiment. Specifically, FIG. 24 shows a state in which a ferroelectric film FE4 is formed by performing a heat treatment for crystallization on an amorphous film to be the ferroelectric layer FEL.

As in the present embodiment, the ferroelectric memory cell MC including the ferroelectric layer FEL is provided also in the studied example. However, the ferroelectric layer FEL of the studied example is a single layer film of the ferroelectric film FE4, and is not a stacked film of the ferroelectric film FE1 and the ferroelectric film FE2 and does not include the plurality of grains GR unlike the ferroelectric memory cell MC in the present embodiment. In addition, the ferroelectric film FE4 contains hafnium (Hf), oxygen (O), and the first element made of zirconium (Zr).

For example, in the case of a hafnium oxide film ($HfO_2$) when an amorphous film is deposited by the ALD method or the like and then heat treatment is performed at a high temperature of about 700 to 1000° C., the crystal phase of the $HfO_2$ film becomes monoclinic, so that the $HfO_2$ film becomes paraelectric instead of ferroelectric. Therefore, by adding the first element made of zirconium (Zr) to the $HfO_2$ film, the ferroelectric film FE4 is easily formed as an orthorhombic crystal. Further, by forming the metal film MF1 such as titanium nitride on the amorphous film, the orientation of the ferroelectric film FE4 can be easily controlled.

In the ferroelectric memory cell MC, the threshold voltage is controlled by controlling the inversion of the polarization domain in the ferroelectric layer FEL by applying positive and negative voltages to the gate electrode. Therefore, the variation in the threshold voltage in the ferroelectric memory cell MC largely depends on the variation in the crystal grain size and the variation in the crystal orientation of the ferroelectric film FE4. In addition, since the film quality in the ferroelectric layer FEL deteriorates when the number of times of rewriting of the ferroelectric memory cell MC increases, the magnitude of the variation in crystal grain size and the variation in crystal orientation greatly affects the variation in the threshold voltage.

The studies by the inventor of the present application have revealed that the variation in crystal grain size and the variation in crystal orientation of the ferroelectric film FE4 cannot be sufficiently suppressed in the studied example and the variation in the threshold voltage increases as the number of times of rewriting of the ferroelectric memory cell MC increases.

On the other hand, in the present embodiment, a stacked structure of the amorphous film AM1 and the amorphous film AM2 is adopted for the formation of the ferroelectric layer FEL, and the plurality of grains GR are further provided between the amorphous film AM1 and the amorphous film AM2. The radius of the crystal grain size of each of the plurality of grains GR is precisely controlled within the range of, for example, 0.1 nm to 1 nm. Further, by performing heat treatment for crystallization on the amorphous film AM1, the amorphous film AM2 and the plurality of grains GR in a state in which the metal film MF1 is formed on the amorphous film AM2, the crystal grain size of each of the ferroelectric film FE1 and the ferroelectric film FE2 is aligned according to the crystal grain size of the plurality of grains GR. Therefore, the uniformity of the crystal grain size in the ferroelectric layer FEL is improved. Thus, in the ferroelectric layer FEL, the uniformity of the crystal grain size can be improved, and the orientation of the crystal can be aligned to be orthorhombic.

When the ferroelectric layer FEL including the ferroelectric film FE1, the ferroelectric film FE2, and the plurality of grains GR formed in this manner is applied to the ferroelectric memory cell MC, the above-described problem that the variation in the threshold voltage increases can be suppressed. Therefore, the problem of the decrease in the rewrite endurance of the ferroelectric memory cell MC or the decrease in the retention can be suppressed. Namely, the performance of the semiconductor device can be improved by the technique of the present embodiment.

Further, in the present embodiment, the electromagnetic wave such as the microwave is used for the heat treatment for crystallization. The heat treatment using the microwave is capable of crystallization at a lower temperature, and can be performed at a temperature of, for example, 400° C. or lower. As a result, the crystal phase of the ferroelectric film FE1 and the ferroelectric film FE2 can be easily formed as an orthorhombic crystal, and the ferroelectric film FE1 and the ferroelectric film FE2 can be easily formed as ferroelectric instead of paraelectric.

Modified Example

Hereinafter, a semiconductor device according to a modified example of the first embodiment will be described with reference to FIG. 18. In the following description, differences from the first embodiment will be mainly described.

Figure 18:
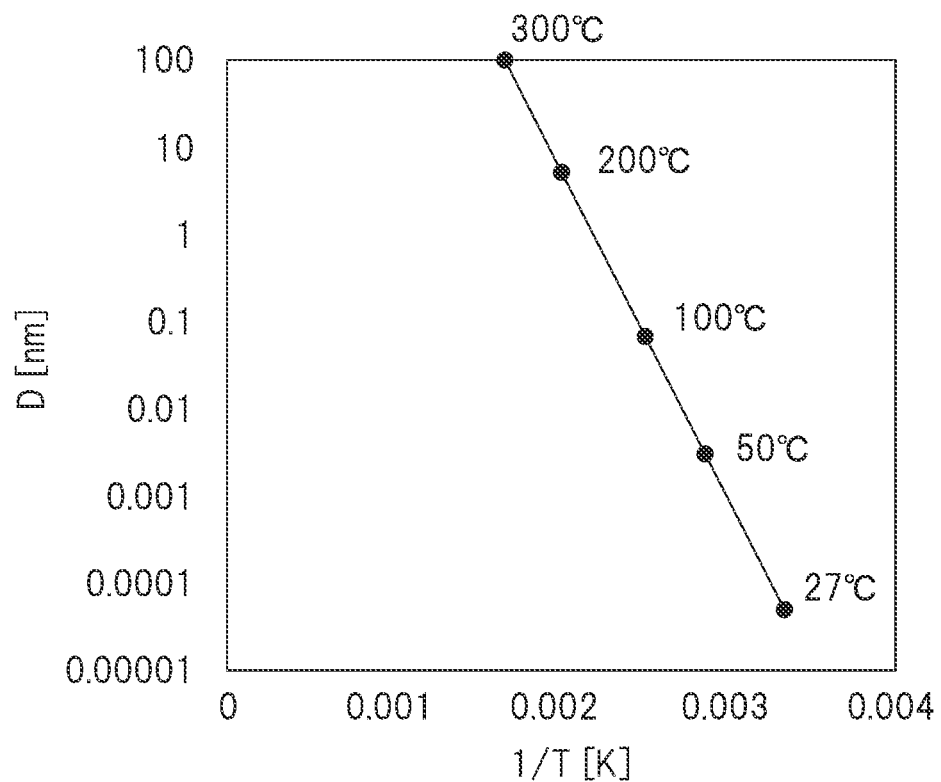
FIG. 18 is a graph obtained by experiments conducted by an inventor of this application.

FIG. 18 is a graph obtained by experiments conducted by the inventor of the present application, and shows temperature comparison when the plurality of grains GR are formed by the sputtering method in the step of FIG. 9 of the first embodiment. Here, an example in which aluminum is applied to the second element constituting the plurality of grains GR is shown. In FIG. 18, the vertical axis represents a diffusion length D in which aluminum diffuses into the amorphous film AM1, and the horizontal axis represents a reciprocal (1/T) of the Kelvin temperature T [K] during the sputtering process.

In the first embodiment, by forming the plurality of grains GR by the sputtering method at a temperature of 300° C. or lower, the diffusion of aluminum as the plurality of grains GR into the amorphous film AM1 is suppressed. Aluminum serves as a crystal nucleus when the amorphous film AM1 and the amorphous film AM2 are crystallized into the ferroelectric film FE1 and the ferroelectric film FE2. Therefore, it is preferable that more crystal nuclei are present in the vicinity of the upper surface of the amorphous film AM1, that is, in the vicinity of the interface between the amorphous film AM1 and the amorphous film AM2. Namely, it is preferable that aluminum as the plurality of grains GR does not diffuse into the amorphous film AM1 too much when the plurality of grains GR are formed by the sputtering method.

As can be seen from the graph of FIG. 18, the diffusion length D of the plurality of grains GR decreases as the formation temperature of the plurality of grains GR decreases. From this graph, the formation temperature of the plurality of grains GR is preferably 1° C. or higher and 150°

C. or lower, more preferably 100° C. or lower, and most preferably 27° C. (room temperature) or lower.

By forming the plurality of grains GR at a lower temperature as described above, the uniformity of crystal grain size can be further improved in the ferroelectric layer FEL, and the orientation of the crystal can be easily aligned to be orthorhombic.

Second Embodiment

Figure 19:
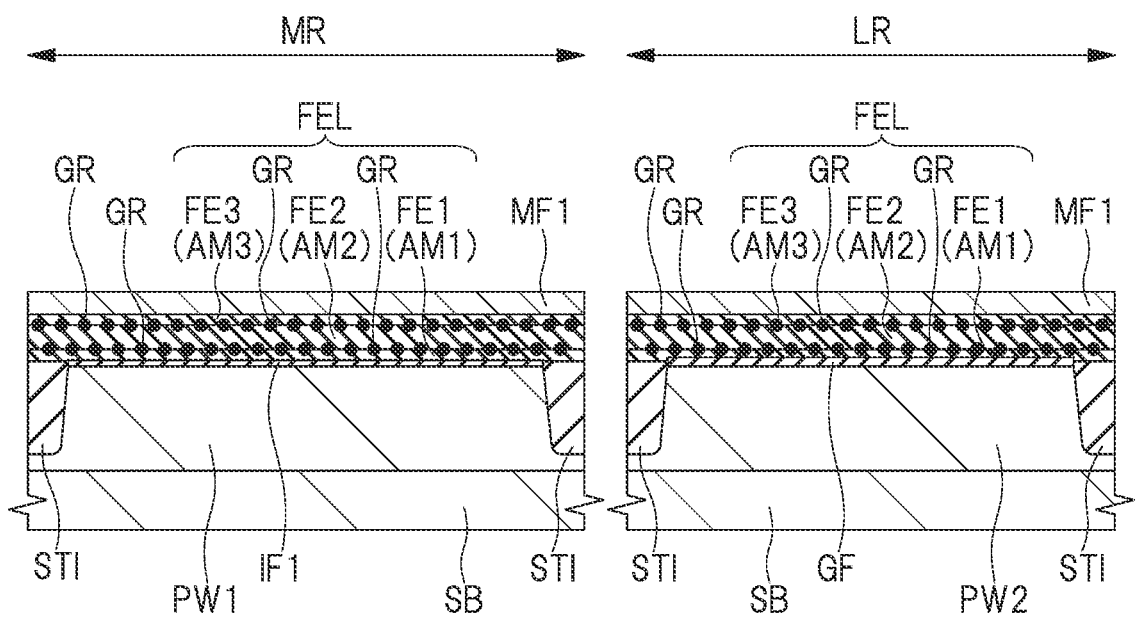
FIG. 19 is a cross-sectional view showing a manufacturing process of a semiconductor device according to a second embodiment.

Hereinafter, a semiconductor device according to the second embodiment will be described with reference to FIG. 19. In the following description, differences from the first embodiment will be mainly described. FIG. 19 is a cross-sectional view of a manufacturing process corresponding to FIG. 12 of the first embodiment.

In the first embodiment, a two-layer structure of the ferroelectric film FE1 and the ferroelectric film FE2 is applied as the ferroelectric layer FEL. In the second embodiment, a three-layer structure of the ferroelectric film FE1, the ferroelectric film FE2 and a ferroelectric film FE3 is applied as the ferroelectric layer FEL.

FIG. 19 shows a state after the heat treatment for crystallization by microwave or the like has been applied similarly to FIG. 12 of the first embodiment.

First, as is the case with the manufacturing process described with reference to FIGS. 8 to 10 of the first embodiment, the amorphous film AM1, the plurality of grains GR and the amorphous film AM2 are sequentially formed on the insulating film IF1 in the region MR and the region LR.

Next, as shown in FIG. 19, the plurality of grains GR are formed again on the amorphous film AM2 by the sputtering method. Then, an amorphous film AM3 is formed on the plurality of grains GR and on the amorphous film AM2 by, for example, the ALD method. The material constituting the amorphous film AM3 is the same as those of the amorphous film AM1 and the amorphous film AM2.

In the second embodiment, the thickness of the amorphous film AM1 is about 2.5 nm, the thickness of the amorphous film AM2 is about nm, and the thickness of the amorphous film AM3 is about 2.5 nm. Namely, the thickness of each of the amorphous film AM1 and the amorphous film AM3 of the second embodiment is smaller than 5 nm which is the thickness of the amorphous film AM1 of the first embodiment.

Next, as is the case with the manufacturing process described with reference to FIG. 11 of the first embodiment, the metal film MF1 is formed on the amorphous film AM3.

Next, in a state in which the metal film MF1 is formed on the amorphous film AM3, heat treatment is performed to crystallize the amorphous films AM1 to AM3, respectively, thereby forming the ferroelectric films FE1 to FE3 which are orthorhombic crystals. As a result, the ferroelectric layer FEL including the ferroelectric films FE1 to FE3 and the plurality of grains GR is formed. Also, as in the first embodiment, this heat treatment may be performed by the RTA method at a temperature of 600° C. or lower, but it is preferable to perform this heat treatment by microwave at a temperature of 400° C. or lower.

As described above, in the second embodiment, the plurality of grains GR are formed between the amorphous film AM1 and the amorphous film AM2 and between the amorphous film AM2 and the amorphous film AM3. Therefore, the number of the plurality of grains GR serving as the crystal nuclei is larger in the second embodiment than that in the first embodiment. Furthermore, since the thicknesses of the amorphous film AM1 and the amorphous film AM3 are small, the crystal grain sizes of the amorphous film AM1 and the amorphous film AM3 are easily grown according to the crystal grain sizes of the plurality of grains GR. Therefore, in the second embodiment, it is possible to further improve the uniformity of the crystal grain sizes of the ferroelectric films FE1 to FE3 as compared with the first embodiment.

In addition, referring to the graph of the second embodiment in FIG. 3, in the ferroelectric layer FEL, the concentration peak of aluminum (Al) which is the plurality of grains GR is high in the vicinity of the interface between the ferroelectric film FE1 and the ferroelectric film FE2 and in the vicinity of the interface between the ferroelectric film FE2 and the dielectric film FE3. Also, the concentration peak of aluminum (Al) is low or the concentration peak of aluminum (Al) is not present in the vicinity of the lower surface of the ferroelectric film FE1, in the vicinity of the central portion of the ferroelectric film FE2, and in the vicinity of the upper surface of the ferroelectric film FE3.

As described above, the concentration peak of the plurality of grains GR is higher at the position close to a first interface between the ferroelectric film FE1 and the ferroelectric film FE2 and at the position close to a second interface between the ferroelectric film FE2 and the ferroelectric film FE3 than those at the position close to the lower surface of the ferroelectric film FE1, at the central portion of the ferroelectric film FE2, and at the position close to the upper surface of the ferroelectric film FE3. Therefore, since the plurality of grains GR are present in the vicinity of the first interface between the ferroelectric film FE1 and the ferroelectric film FE2 and in the vicinity of the second interface between the ferroelectric film FE2 and the ferroelectric film FE3, each of the ferroelectric films FE1 to FE3 has a highly uniform crystal grain size and is easily formed as an orthorhombic crystal.

Accordingly, when the ferroelectric layer FEL is applied to the ferroelectric memory cell MC, it is possible to further suppress the problem of the increase in the variation in the threshold voltage due to the polarization inversion of the ferroelectric layer FEL, so that the problem of the decrease in the rewrite endurance of the ferroelectric memory cell MC or the decrease in the retention can be further suppressed. Namely, the performance of the semiconductor device can be further improved by the technique of the second embodiment.

Also in the second embodiment, when the ratio of hafnium, the ratio of the first element (Zr or the like), the ratio of the second element constituting the plurality of grains GR in the ferroelectric layer FEL are compared, the ratio of the second element is smaller than the ratio of hafnium and the ratio of the first element as in the first embodiment. Specifically, when the sum of the ratio of hafnium, the ratio of the first element and the ratio of the second element is 100%, the ratio of hafnium is within the range of 30% to 50%, the ratio of the first element is within the range of 30% to 50%, and the ratio of the second element is within the range of 0.5% to 5.0% in the ferroelectric layer FEL.

In addition, although the ferroelectric layer FEL having a three-layer structure of the ferroelectric films FE1 to FE3 has been described in the second embodiment, it is also possible to form a plurality of ferroelectric films of three or more layers and form the plurality of grains GR between them. In that case, the uniformity of crystal grain size in the ferroelectric layer FEL can be further improved.

Third Embodiment

Hereinafter, a semiconductor device according to the third embodiment will be described with reference to FIG. 20. In the following description, differences from the first embodiment will be mainly described.

Although the ferroelectric memory cell MC having the MFIS structure has been described as an example in the first embodiment, a memory cell referred to as MFMIS (Metal Ferroelectric Metal Insulator Semiconductor) structure in which the ferroelectric layer FEL is applied to the transistor structure will be described as the ferroelectric memory cell MC in the third embodiment.

Figure 20:
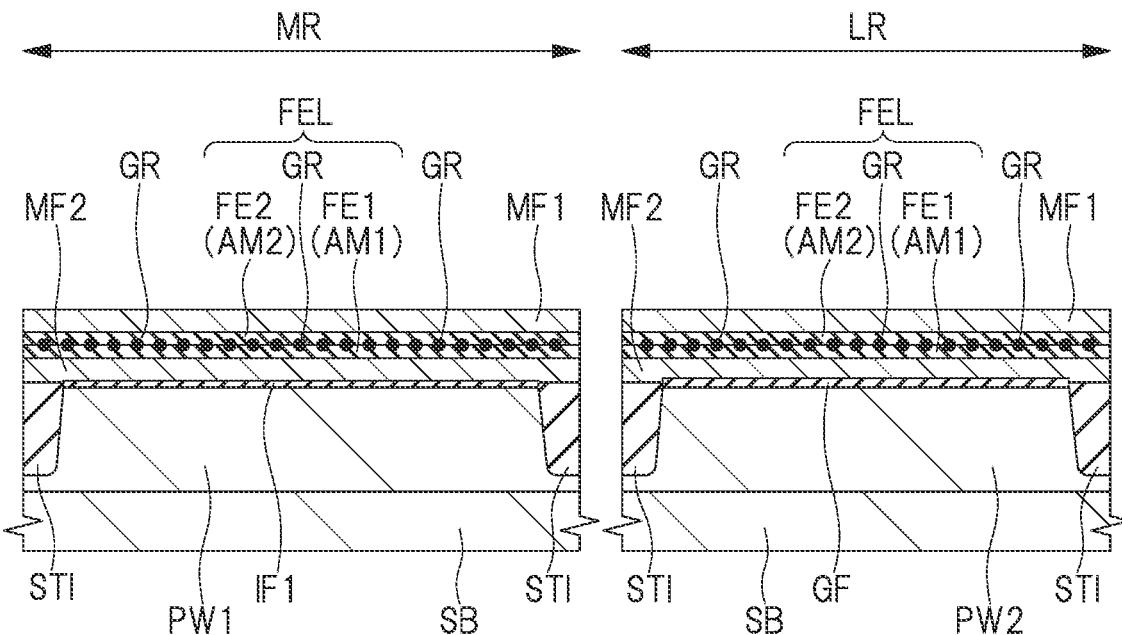
FIG. 20 is a cross-sectional view showing a manufacturing process of a semiconductor device according to a third embodiment.

FIG. 20 is a cross-sectional view corresponding to the point when the step of FIG. 12 of the first embodiment is completed.

As shown in FIG. 20, in the ferroelectric memory cell MC according to the third embodiment, a metal film MF2 is formed between the ferroelectric layer FEL and the insulating film IF1. The metal film MF2 can be formed between the step of FIG. 7 and the step of FIG. 8 of the first embodiment. Namely, after the insulating film IF1 is formed in the region MR in FIG. 7, the metal film MF2 is formed on the insulating film IF1 in the region MR and on the gate insulating film GF in the region LR. Thereafter, the amorphous film AM1 is formed on the metal film MF2 in the region MR and the region LR by the same method as the manufacturing method described with reference to FIG. 8. The metal film MF2 is made of the same material as the metal film MF1 and can be formed by the same manufacturing method as the metal film MF1.

As with the metal film MF1, the metal film MF2 has a function to orient the crystal phase of each of the ferroelectric film FE1 and the ferroelectric film FE2 to be orthorhombic when the amorphous film AM1 and the amorphous film AM2 are crystallized into the ferroelectric film FE1 and the ferroelectric film FE2. Therefore, the orientation of each of the ferroelectric film FE1 and the ferroelectric film FE2 is controlled not only by the stress from the metal film MF1 but also by the stress from the metal film MF2. Therefore, in the third embodiment, the stress for controlling the crystal phase of each of the ferroelectric film FE1 and the ferroelectric film FE2 is larger as compared with the first embodiment, and thus each of the ferroelectric film FE1 and the ferroelectric film FE2 can be more reliably formed into an orthorhombic crystal.

Further, it is also possible to apply the technique disclosed in the second embodiment to the technique disclosed in the third embodiment.

Fourth Embodiment

Hereinafter, a semiconductor device according to the fourth embodiment will be described with reference to FIG. 21. In the following description, differences from the third embodiment will be mainly described.

Although the ferroelectric memory cell MC having the MFMIS structure in which the ferroelectric layer FEL is applied to the transistor structure has been described as an example in the third embodiment, the ferroelectric memory cell MC is configured by forming the ferroelectric layer FEL in the wiring layer and electrically connecting the ferroelectric layer FEL and a MISFET 2Q formed on the semiconductor substrate SB to each other in the fourth embodiment.

Figure 21:
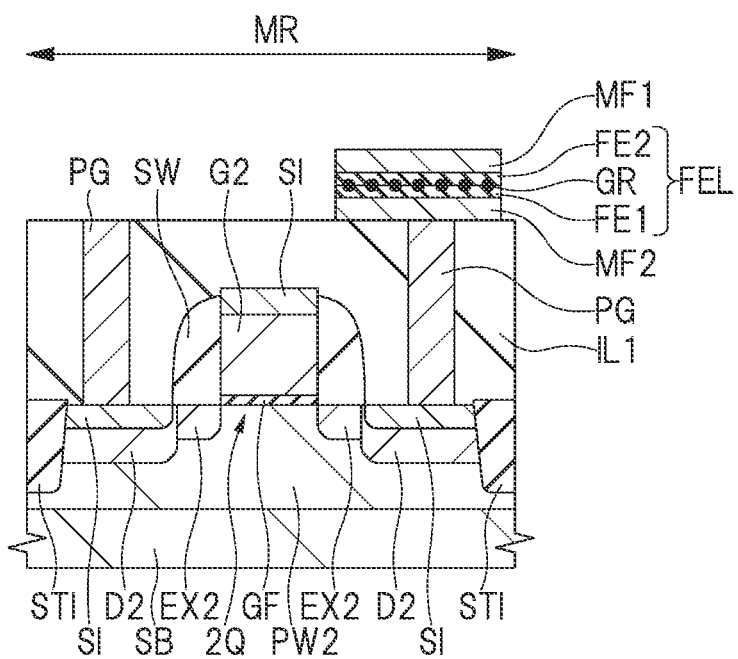
FIG. 21 is a cross-sectional view showing a semiconductor device according to a fourth embodiment.

FIG. 21 shows only the region MR in which the ferroelectric memory cell MC is formed. As shown in FIG. 21, the MISFET 2Q is formed on the semiconductor substrate SB. For example, the MISFET 2Q has the same structure as the MISFET 1Q of the first embodiment and is formed by the same manufacturing method as the MISFET 1Q.

The diffusion region D2 to be the drain region of the MISFET 2Q is connected to the metal film MF2 via the plug PG. The ferroelectric layer FEL is formed on the metal film MF2, and the metal film MF1 is formed on the ferroelectric layer FEL.

The polarization inversion of the ferroelectric layer FEL is performed by the voltage supplied from the diffusion region D2 to be the drain region of the MISFET 2Q. Namely, the MISFET 2Q constitutes a selection transistor of the ferroelectric memory cell MC.

Since the ferroelectric layer FEL of the ferroelectric memory cell MC like this does not have to be formed on the semiconductor substrate SB and is formed in the wiring layer, the device area of the semiconductor substrate SB can be reduced. Therefore, the ferroelectric memory cell MC according to the fourth embodiment is advantageous in the miniaturization of the semiconductor chip CHP.

Fifth Embodiment

Figure 22:
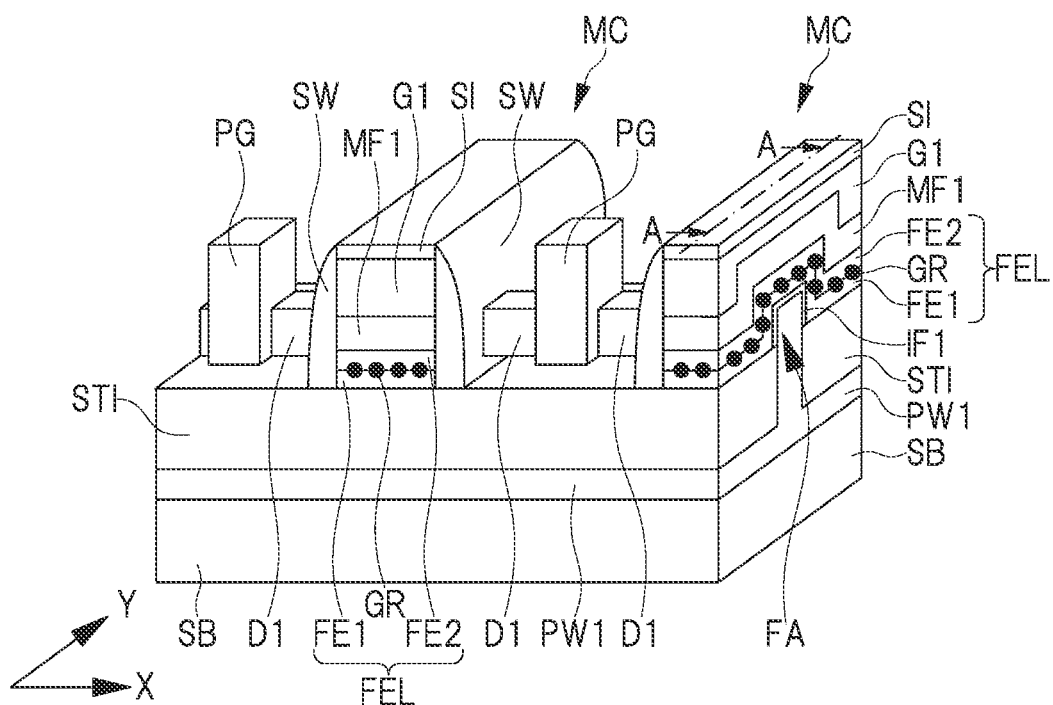
FIG. 22 is a perspective view showing a semiconductor device according to a fifth embodiment.
Figure 23:
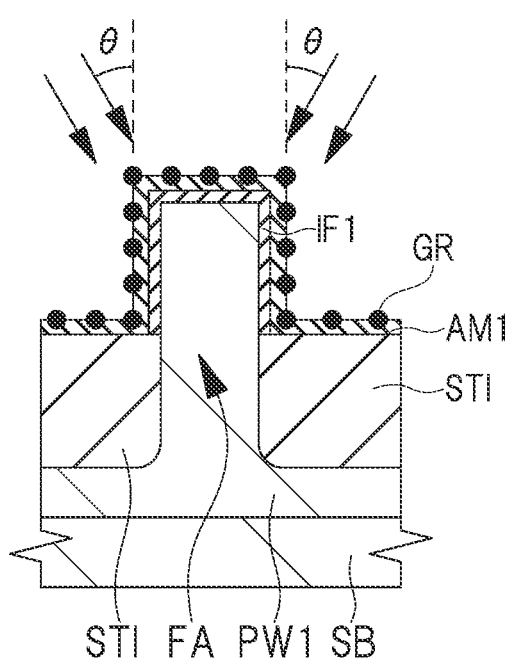
FIG. 23 is a cross-sectional view showing a manufacturing process of the semiconductor device according to the fifth embodiment.

Hereinafter, a semiconductor device according to the fifth embodiment will be described with reference to FIGS. 22 and 23. In the following description, differences from the first embodiment will be mainly described. FIG. 22 is a perspective view of the ferroelectric memory cell MC according to the fifth embodiment, and FIG. 23 is a cross-sectional view taken along a line A-A shown in FIG. 22 and is a cross-sectional view in the manufacturing process.

Although the ferroelectric memory cell MC having the MFIS structure which is a planar transistor on the semiconductor substrate SB has been described as an example in the first embodiment, the case in which the ferroelectric memory cell MC having the MFIS structure is applied to a fin transistor will be described as an example in the fifth embodiment.

FIG. 22 shows only the region MR in which the ferroelectric memory cell MC is formed, and the case in which two ferroelectric memory cells MC are formed on the fin FA is shown as an example.

In plan view, the fin FA extending in the X direction is formed on the semiconductor substrate SB. Although not shown, a plurality of such fins FA are formed, and the plurality of fins FA are arranged at equal intervals in the Y direction. The X direction and the Y direction are directions along the main surface of the semiconductor substrate SB, and the X direction is orthogonal to the Y direction. A length of the fin FA in the X direction is larger than a length of the fin FA in the Y direction. Namely, the X direction is a long-side direction of the fin FA and the Y direction is a short-side direction of the fin FA. The fin FA is a part of the semiconductor substrate SB and is a rectangular parallelepiped protruding portion (convex portion) selectively protruding from the upper surface of the semiconductor substrate SB.

The element isolation portion STI is formed in the semiconductor substrate SB between the plurality of fins FA. A position of the upper surface of the element isolation portion STI is lower than a position of the upper surface of the fin FA. In other words, a part of the fin FA protrudes beyond the element isolation portion STI, and the other portion of the fin FA is located so as to be sandwiched between the element isolation portions STI in the Y direction. In this manner, the upper part of each fin FA is insulated and separated by the element isolation portion STI. A portion of fin FA protruding beyond the element isolation portion STI is mainly an active region for forming ferroelectric memory cell MC. Namely, in the semiconductor substrate SB, the region partitioned by the element isolation portion STI is the active region.

The insulating film IF1 is formed on the upper surface and the side surface of the fin FA, the ferroelectric layer FEL is formed on the insulating film IF1 and on the element separation portion STI, and the metal film MF1 is formed on the ferroelectric layer FEL. The gate electrode G1 is formed on the upper surface and the side surface of the fin FA via the metal film MF1, the ferroelectric layer FEL and the insulating film IF1, and extends in the Y direction.

The p-type well PW1 is formed in the entirety of the fin FA and a part of the semiconductor substrate SB. In the fin FA, the n-type diffusion regions D1 are formed as the drain region and the source region of the ferroelectric memory cell MC. The fin FA sandwiched between the two diffusion regions D1 and covered with the gate electrode G1 constitutes the channel region of the ferroelectric memory cell MC. In addition, these diffusion regions D1 are formed by substantially the same method as the diffusion region D1 of the first embodiment. Here, the case in which the two ferroelectric memory cells MC adjacent to each other in the X direction share the diffusion region D1 is illustrated.

As described above, the ferroelectric memory cell MC is formed by using the upper surface and the side surface of the fin FA in the fifth embodiment. Therefore, the area in which the polarization inversion of the ferroelectric layer FEL is performed can be increased in the film thickness direction as compared with the ferroelectric memory cell MC of the planar transistor according to the first embodiment. Therefore, when the memory capacity of the fifth embodiment is approximately the same as that of the first embodiment, it is possible to reduce the occupation area of the ferroelectric memory cell MC in the semiconductor substrate SB. Namely, it is possible to miniaturize the semiconductor device.

FIG. 23 shows a manufacturing process of the plurality of grains GR according to the fifth embodiment, which is a manufacturing process corresponding to FIG. 9 in the first embodiment.

Arrows in FIG. 23 represent the state in which the plurality of grains GR are formed by the ion implantation method. Since the fin FA is applied in the fifth embodiment, it is difficult to form the plurality of grains GR on the amorphous film AM1 formed on the side surface of the fin FA by the sputtering method.

Therefore, in the fifth embodiment, the plurality of grains GR are introduced to the amorphous film AM1 from the direction along the Y direction in FIG. 22 (the gate width direction of the ferroelectric memory cell MC) by the oblique ion implantation method. For example, this ion implantation is performed at an angle inclined by an angle θ from a perpendicular line with respect to the upper surface of the semiconductor substrate SB. The angle θ is, for example, in the range of 15 degrees or more and 45 degrees or less. In this way, it is possible to form the plurality of grains GR on the amorphous film AM1 formed on the upper surface and the side surface of the fin FA. Note that the second element constituting the plurality of grains GR, the concentration of the plurality of grains GR and others are the same as those in the first embodiment.

Since the subsequent manufacturing process is substantially the same as that in the first embodiment, the description thereof will be omitted.

Further, it is also possible to apply the techniques disclosed in the second embodiment and the third embodiment to the technique disclosed in the fifth embodiment.

In the foregoing, the invention made by the inventor of the present application has been concretely described based on the embodiments. However, it is needless to say that the present invention is not limited to the foregoing embodiments and various modifications can be made within the scope of the present invention.

What is claimed is:

1. A semiconductor device comprising:
   a semiconductor substrate;
   a ferroelectric layer formed on the semiconductor substrate, the ferroelectric layer comprising:
   a first ferroelectric film; and
   a second ferroelectric film formed on the first ferroelectric film; and
   a gate electrode formed on the ferroelectric layer,
   wherein the first ferroelectric film and the second ferroelectric film contain hafnium and oxygen,
   wherein the ferroelectric layer further includes a plurality of grains containing one of aluminum, carbon, nitrogen, fluorine and titanium, between the first ferroelectric film and the second ferroelectric film, and
   wherein the second ferroelectric film is in direct contact with i) the plurality of grains and ii) an upper surface of the first ferroelectric film.

2. The semiconductor device according to claim 1, wherein the plurality of grains are formed so as to be separated from each other between the first ferroelectric film and the second ferroelectric film.

3. The semiconductor device according to claim 2, wherein each of the first ferroelectric film and the second ferroelectric film is an orthorhombic crystal.

4. The semiconductor device according to claim 1,
   wherein the ferroelectric layer further includes a third ferroelectric film formed on the second ferroelectric film,
   wherein the third ferroelectric film contains hafnium and oxygen,
   wherein the plurality of grains are formed also between the second ferroelectric film and the third ferroelectric film, and
   wherein a concentration peak of the plurality of grains is higher at a position close to a first interface between the first ferroelectric film and the second ferroelectric film and at a position close to a second interface between the second ferroelectric film and the third ferroelectric film than those at a position close to a lower surface of the first ferroelectric film, at a position close to a central portion of the second ferroelectric film, and at a position close to an upper surface of the third ferroelectric film.

5. The semiconductor device according to claim 1,
   wherein each of the first ferroelectric film and the second ferroelectric film contains a first element, and
   wherein the first element is one of zirconium, silicon, germanium, yttrium, lanthanum and ytterbium.

6. The semiconductor device according to claim 1, wherein the ferroelectric layer constitutes a part of an electrically rewritable ferroelectric memory cell.

7. The semiconductor device according to claim 6,
   wherein the ferroelectric memory cell includes the ferroelectric layer and a selection transistor,
   wherein the selection transistor includes:
   a gate insulating film formed on the semiconductor substrate;
   a second gate electrode formed on the gate insulating film; and a source region and a drain region formed in the semiconductor substrate, wherein the selection transistor is covered with an interlayer insulating film, wherein the ferroelectric layer is formed on the interlayer insulating film, and wherein a plug which electrically connects the drain region and the ferroelectric layer to each other is formed in the interlayer insulating film.

8. The semiconductor device according to claim 1, wherein the ferroelectric layer further comprises a plurality of compounds composed of a part of the grains and hafnium or oxygen contained in a part of the first ferroelectric film and the second ferroelectric film.

9. The semiconductor device according to claim 1, wherein a radius of a crystal grain size of the plurality of grains is in a range of 0.1 nm to 1 nm.

* * * * *